(12) United States Patent
Kim et al.

(10) Patent No.: US 10,559,585 B2
(45) Date of Patent: Feb. 11, 2020

(54) VERTICAL MEMORY DEVICES WITH CONDUCTIVE PADS SUPPORTED BY DUMMY CHANNELS WITH VARYING DIMENSIONS

(71) Applicant: Samsung Electronics Co., Ltd., Suwon-si, Gyeonggi-do (KR)

(72) Inventors: Kyoung-Hoon Kim, Seoul (KR); Hong-Soo Kim, Seongnam-si (KR); Tae-Hee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/871,478

(22) Filed: Jan. 15, 2018

(65) Prior Publication Data
US 2018/0337192 A1 Nov. 22, 2018

(30) Foreign Application Priority Data

May 17, 2017 (KR) .................... 10-2017-0060927

(51) Int. Cl.
| | | |
|---|---|---|
| *H01L 27/11582* | (2017.01) | |
| *H01L 27/11565* | (2017.01) | |
| *H01L 27/11575* | (2017.01) | |
| *H01L 27/11556* | (2017.01) | |
| *H01L 23/522* | (2006.01) | |

(52) U.S. Cl.
CPC .... *H01L 27/11582* (2013.01); *H01L 23/5226* (2013.01); *H01L 27/11556* (2013.01); *H01L 27/11565* (2013.01); *H01L 27/11575* (2013.01)

(58) Field of Classification Search
None
See application file for complete search history.

(56) References Cited

U.S. PATENT DOCUMENTS

| | | | |
|---|---|---|---|
| 8,426,908 | B2 | 4/2013 | Higashi |
| 9,184,060 | B1 | 11/2015 | Lee |
| 9,245,839 | B2 | 1/2016 | Chae et al. |
| 9,318,430 | B2 | 4/2016 | Tang et al. |
| 9,412,749 | B1 | 8/2016 | Shimabukuro et al. |
| 9,576,967 | B1 * | 2/2017 | Kimura ............ H01L 27/11565 |

(Continued)

FOREIGN PATENT DOCUMENTS

KR 10-2016-0058031 5/2016

*Primary Examiner* — Matthew L Reames
*Assistant Examiner* — John A Bodnar
(74) *Attorney, Agent, or Firm* — Sughrue Mion, PLLC

(57) ABSTRACT

A vertical memory device includes a conductive pattern structure on a first region of a substrate, the conductive pattern structure including a stack of interleaved conductive patterns and insulation layers. A pad structure is disposed on a second region of the substrate adjacent the first region of the substrate wherein edges of the conductive patterns are disposed at spaced apart points along a first direction to provide conductive pads arranged as respective steps in a staircase arrangement. A plurality of channel structures extends through the conductive pattern structure and a plurality of dummy channel structures extends through the pad structure. Respective contact plugs are disposed on the conductive pads. Numbers of the dummy channel structures per unit area passing through the conductive pads vary. Widths of the dummy channel structures passing through the conductive pads may also vary.

14 Claims, 21 Drawing Sheets

(56) References Cited

U.S. PATENT DOCUMENTS

| | | | |
|---|---|---|---|
| 9,881,929 B1* | 1/2018 | Ravikirthi | H01L 27/11519 |
| 2015/0129935 A1* | 5/2015 | Tang | H01L 27/101 257/202 |
| 2016/0322381 A1 | 11/2016 | Liu et al. | |
| 2016/0343727 A1 | 11/2016 | Kim et al. | |

* cited by examiner

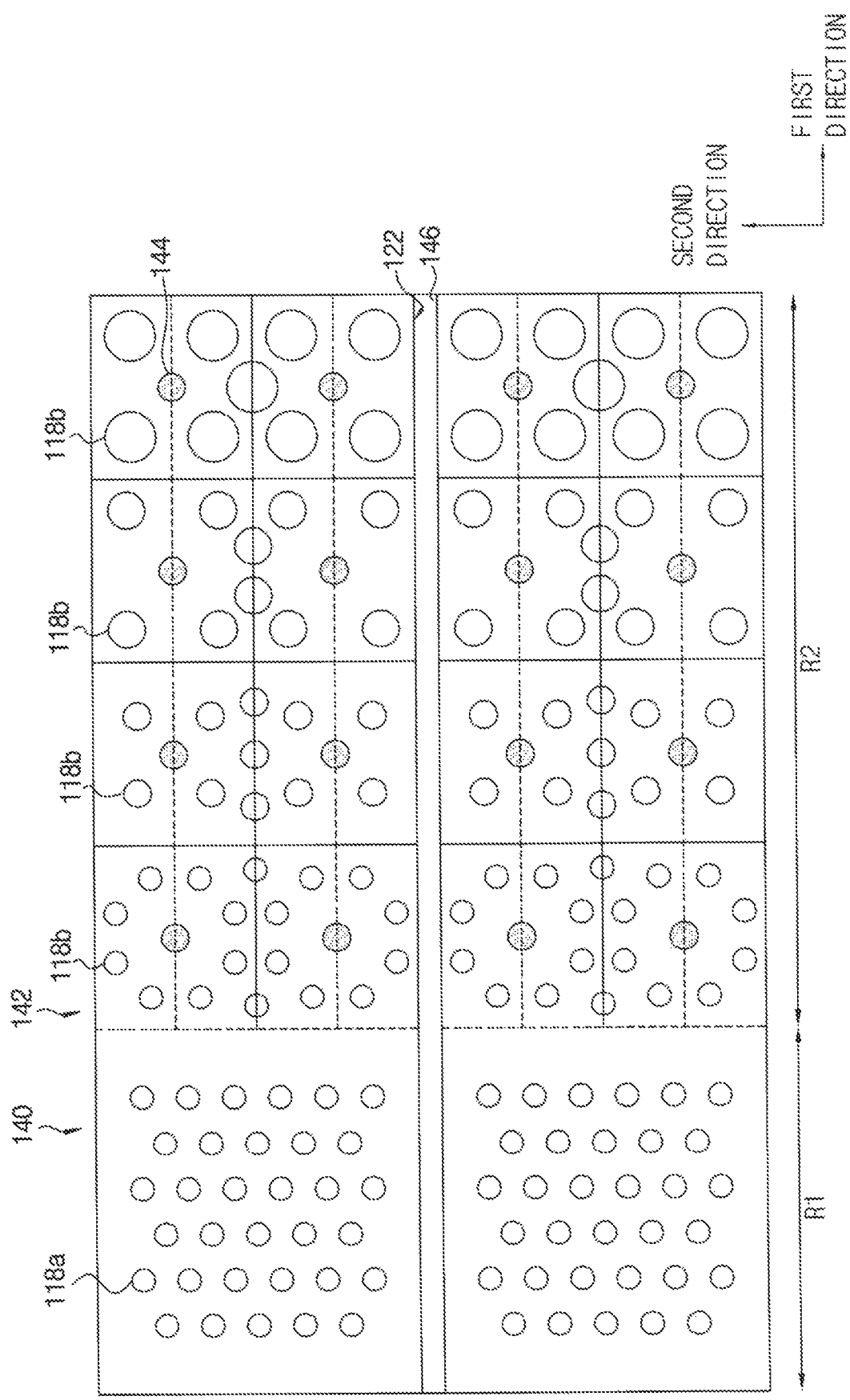

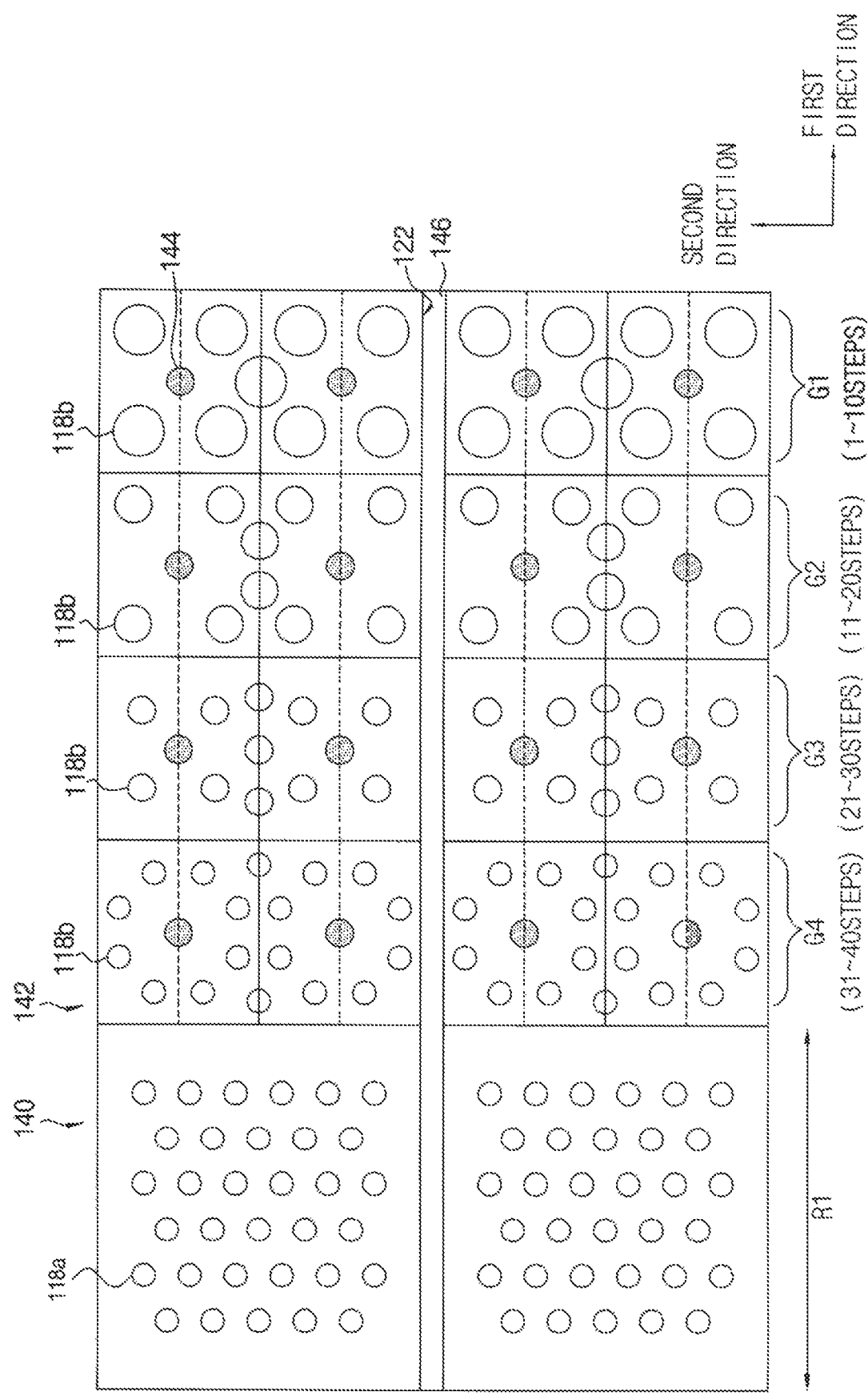

VERTICAL MEMORY DEVICES WITH CONDUCTIVE PADS SUPPORTED BY DUMMY CHANNELS WITH VARYING DIMENSIONS

CROSS-REFERENCE TO RELATED APPLICATION

This application claims priority under 35 USC § 119 to Korean Patent Application No. 10-2017-0060927, filed on May 17, 2017, in the Korean Intellectual Property Office (KIPO), the contents of which are incorporated by reference herein in their entirety.

BACKGROUND

1. Field

Example embodiments relate to vertical memory devices. More particularly, example embodiments relate to vertical NAND flash memory devices.

2. Description of the Related Art

A vertical memory device including a plurality of memory cells vertically stacked at a plurality of levels, respectively, on a substrate has been developed. As the number of the levels increases, the vertical memory device may have an unstable structure.

SUMMARY

Example embodiments can provide vertical memory devices having a structure with improved stability.

According to example embodiments, a vertical memory device includes a conductive pattern structure on a substrate and comprising a stack of interleaved conductive patterns and insulation layers, wherein edges of the conductive patterns are disposed at spaced apart points along a first direction to provide conductive pads arranged as respective steps in a staircase arrangement. A plurality of channel structures extends through the conductive pattern structure in a second direction perpendicular to the first direction, and a plurality of dummy channel structures extends through the first conductive pads in the second direction. Respective contact plugs are disposed on the conductive pads. A first one of the first conductive pads has a first number of the dummy channel structures passing therethrough and a second one of the first conductive pads has a second number of the dummy channel structures passing therethrough that is different from the first number of the dummy channel structures.

In some embodiments, the dummy channel structures passing through the first one of the conductive pads may have a first width, and the dummy channel structures passing through the second one of the conductive pads may have a second width different than the first width. The first number of dummy channel structures may be less that the second number of the dummy channel structures and the first width may be greater than the second width.

In further example embodiments, a vertical memory device includes a conductive pattern structure on a first region of a substrate, the conductive pattern structure including a stack of interleaved conductive patterns and insulation layers. A pad structure is disposed on a second region of the substrate adjacent the first region of the substrate wherein edges of the conductive patterns are disposed at spaced apart points along a first direction to provide conductive pads arranged as respective steps in a staircase arrangement. A plurality of channel structures extends through the conductive pattern structure and a plurality of dummy channel structures extends through the pad structure. Respective contact plugs are disposed on the conductive pads. Numbers of the dummy channel structures per unit area passing through the conductive pads vary. Widths of the dummy channel structures passing through the conductive pads may also vary. For example, widths of the dummy channel structures passing though the conductive pads may vary in inverse proportion to the number of the dummy channel structures passing through the conductive pads.

In still further embodiments, a vertical memory device includes a conductive pattern structure on a substrate and comprising a stack of interleaved conductive patterns and insulation layers, wherein edges of the conductive patterns are disposed at spaced apart points along a first direction to provide conductive pads arranged as respective steps in a staircase arrangement. A plurality of channel structures extends through the conductive pattern structure in a second direction perpendicular to the first direction and a plurality of dummy channel structures extends through the first conductive pads in the second direction. Respective contact plugs are disposed on the conductive pads. A first one of the first conductive pads has first ones of the dummy channel structures passing therethrough having a first width. A second one of the first conductive pads has second ones of the dummy channel structures passing therethrough having a second width different from the first width. Widths of the dummy channel structures may increase from an uppermost one of the conductive pads toward a lowermost one of the conductive pads, and numbers of the dummy channel structures passing through respective ones of the conductive pads may decrease from the uppermost one of the conductive pads toward the lowermost one of the conductive pads.

In example embodiments, the vertical memory device may have a stable structure by arrangement of the dummy channel structures.

BRIEF DESCRIPTION OF THE DRAWINGS

Example embodiments will be more clearly understood from the following detailed description taken in conjunction with the accompanying drawings. FIGS. 1 to 20 represent non-limiting, example embodiments as described herein.

FIGS. 1A and 2 are a plan view and a cross-sectional view, respectively, illustrating a vertical memory device in accordance with example embodiments;

FIG. 1B is a plan view illustrating a vertical memory device in accordance with example embodiments;

FIGS. 3 to 15 are cross-sectional views, plan views and a perspective view illustrating stages of a method of manufacturing a vertical memory device in accordance with example embodiments;

FIGS. 16 and 17 are a plan view and a cross-sectional view, respectively, illustrating a vertical memory device in accordance with example embodiments;

FIG. 18 is a plan view illustrating a vertical memory device in accordance with example embodiments;

FIG. 19 is a plan view illustrating an arrangement of memory cells in a vertical memory device in accordance with example embodiments; and FIG. 20 is a plan view illustrating a vertical memory device in accordance with example embodiments.

DESCRIPTION OF EMBODIMENTS

Figure 2:
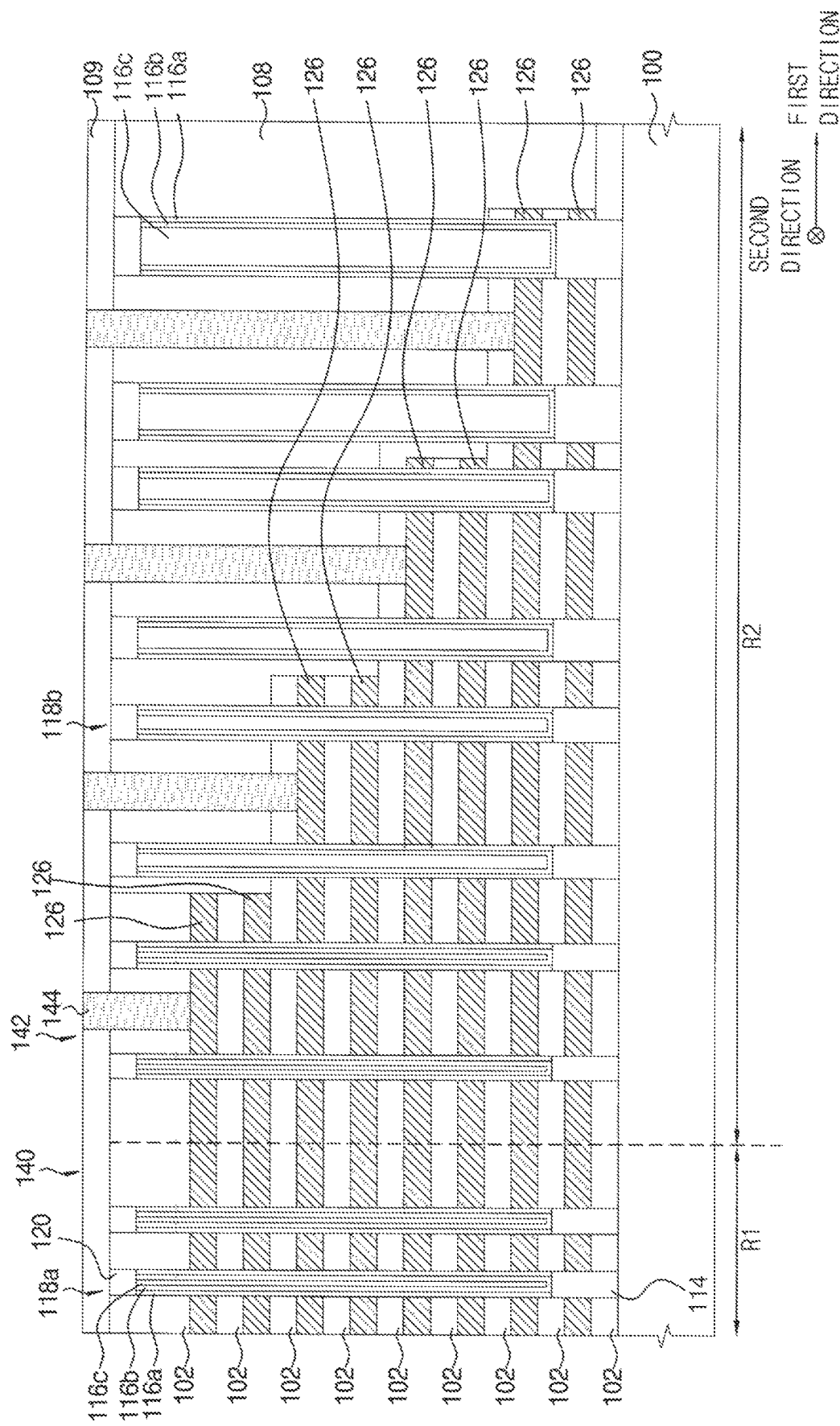

FIGS. 1A and 2 are a plan view and a cross-sectional view, respectively, illustrating a vertical memory device in accordance with example embodiments. FIG. 1B is a plan view illustrating a vertical memory device in accordance with example embodiments.

Referring to FIGS. 1A and 2, a substrate 100 may include a first region R1 on which memory cells may be formed in three dimensions and a second region R2 on which wirings connected with the memory cells may be formed. In example embodiments, the second region R2 may be adjacent to edge portions of the first region R1 in a first direction.

A conductive pattern structure 140 and a channel structure 118a may be formed on the first region R1. A pad structure 142, a dummy channel structure 118b and a contact plug 144 may be formed on the second region R2.

The conductive pattern structure 140 and the channel structure 118a are components of a plurality of memory cells. The pad structure 142 may serve as wirings for conveying electrical signals to and from the conductive pattern structure 140.

The substrate 100 may include a semiconductor material. The substrate 100 may include, for example, a silicon substrate, a germanium substrate or a silicon-germanium substrate.

Hereinafter, the conductive pattern structure 140 formed in the first region R1 will be described.

The conductive pattern structure 140 may include conductive patterns 126 and insulation layers 102 alternately stacked in an interleaved manner. The conductive patterns 126 may be spaced apart along a third direction substantially perpendicular to an upper surface of the substrate 100.

The conductive pattern structure 140 may extend in the first direction. In example embodiments, a plurality of conductive pattern structures 140 may be spaced apart along a second direction substantially perpendicular to the first direction.

The conductive patterns 126 in the conductive pattern structure 140 may include a ground selection line (GSL), a string selection line (SSL) and a plurality of word lines between the GSL and SSL.

The conductive pattern 126 may include a metal. In example embodiments, the conductive pattern 126 may include a metal pattern and a barrier pattern. The metal pattern may include, for example, tungsten, copper, cobalt, aluminum, etc., and the barrier pattern may include, for example, titanium, titanium nitride, tantalum, tantalum nitride, etc.

Hereinafter, the pad structure 142 formed on the second region R2 will be described.

The pad structure 142 may contact edge portions of the conductive pattern structure 140. In particular, the conductive pattern structure 140 and the pad structure 142 may be merged into a single body extending along the first direction.

The pad structure 142 may include the interleaved conductive patterns 126 and insulation layers 102. The conductive patterns 126 in the pad structure 142 and the conductive patterns 126 in the conductive pattern structure 140 may be merged into a single body including substantially the same material. Also, the insulation layers 102 in the pad structure 142 and the insulation layers 102 in the conductive pattern structure 140 may be merged into a single body including substantially the same material.

In example embodiments, an edge portion of the pad structure 142 may have a staircase arrangement. In particular, edges of the conductive patterns 126 may be arranged in a staircase configuration shape, where the conductive patterns 126 have different levels in the third direction. The edges of the conductive patterns 126 having the different levels may serve as pads on which contact plugs may be formed, respectively. In example embodiments, the number of the pads in the pad structure 142 may be substantially the same as the number of the stacked conductive patterns 126 in the conductive pattern structure 140.

Figure 11:
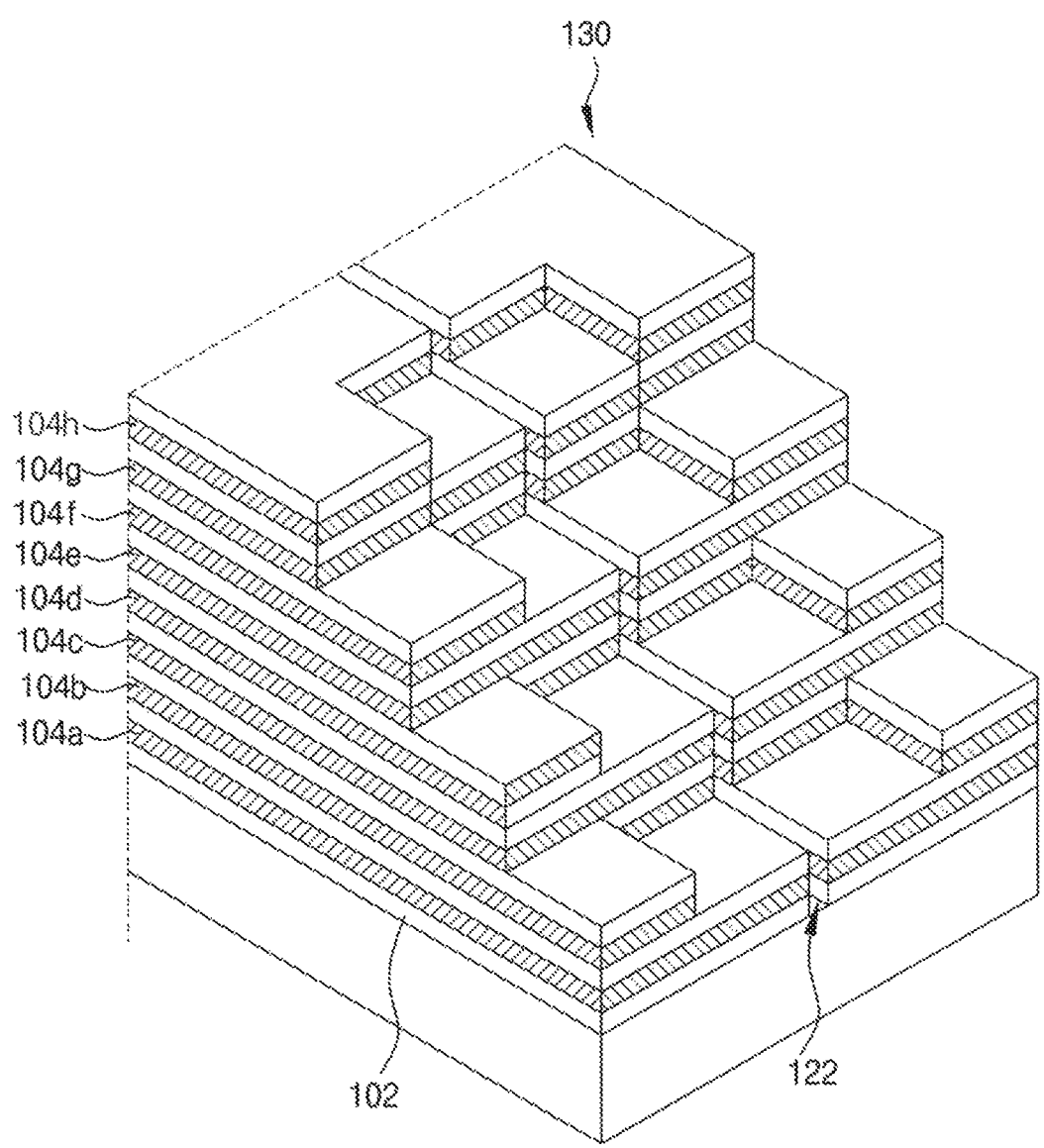

In example embodiments, the pad structure 142 may include step portions in each of the first and second directions. For example, as shown in FIG. 11, the pad structure 142 may include 4 steps disposed at 4 levels, respectively, in the first direction, and 2 steps disposed at 2 sub-levels, respectively, in each level in the second direction. Thus, the pad structure 142 may have 8 steps at 8 different sub-levels, respectively. Also, eight conductive patterns 126 may be stacked in the first region R1.

A first upper insulating interlayer 108 may cover the pad structure 142. A second upper insulating interlayer 109 may be formed on the first upper insulating interlayer 108 and the conductive pattern structure 140.

An upper surface of each of the first and second upper insulating interlayers 108 and 109 may be substantially flat. Thus, a thickness of the first and second upper insulating interlayers 108 and 109 on the pad structure 142 may be greater than a thickness of the second upper insulating interlayer 109 on the conductive pattern structure 140.

The channel structures 118a may extend through the conductive pattern structure 140, and may have a pillar shape. The dummy channel structures 118b may extend through the first upper insulating interlayer 108 and the pad structure 142, and may have a pillar shape.

In example embodiments, respective semiconductor patterns 114 may be formed between the substrate 100 and respective ones of the channel structures 118a. Respective semiconductor patterns 114 may be also formed between the substrate 100 and respective ones of the dummy channel structures 118b. In this case, each of the channel structures 118a and the dummy channel structures 118b may be formed on the respective semiconductor patterns 114. In some example embodiments, each of the channel structures 118a and the dummy channel structures 118b may directly contact the substrate 100, i.e., the semiconductor patterns 114 may be eliminated.

The channel structures 118a and the dummy channel structures 118b may have substantially the same layered structure. In example embodiments, each of the channel structures 118a and the dummy channel structures 118b may include a dielectric structure 116a, a channel 116b and a filling insulation pattern 116c. In example embodiments, the channel 116b may have a hollow cylindrical shape or a cup-like shape. The channel 116b may include polysilicon or single crystalline silicon. A portion of the channel 116b may be doped with p-type impurities, e.g., boron. The filling insulation pattern 116c may be formed on the channel 116b to fill an inner space of the channel 116b. The filling insulation pattern 116c may include an insulation material, e.g., silicon oxide.

In some example embodiments, the channel 116b may have a solid cylindrical shape or a pillar shape. In such embodiments, the filling insulation pattern 116c may be absent. The dielectric structure 116a may surround an outer sidewall of the channel 116b. The dielectric structure 116a may include a tunnel insulation layer, a charge storage layer and a blocking dielectric layer layered on the outer sidewall of the channel 116b. The blocking dielectric layer may include an oxide, e.g., silicon oxide, or a metal oxide, e.g., hafnium oxide or aluminum oxide. The charge storage layer may include a nitride, e.g., silicon nitride, or a metal oxide. The tunnel insulation layer may include an oxide, e.g., silicon oxide. The semiconductor pattern 114 may include, for example, polysilicon or single crystalline silicon.

In example embodiments, the channel structures 118a and the dummy channel structures 118b may further include an upper conductive pattern 120 on the dielectric structure 116a, the channel 116b and the filling insulation pattern 116c. The upper conductive pattern 120 may include, for example, polysilicon.

The channel structures 118a may have a first width. In example embodiments, the channel structures 118a may have a uniform width. However, the dummy channel structures 118b may have widths that vary based on the positions thereof. Each of the dummy channel structures 118b may have a width substantially the same as or greater than the first width.

According to the positions of the dummy channel structures 118b, the number of the dummy channel structures 118b per a unit area (or a density of the dummy channel structures 118b) may vary. For example, where widths of the dummy channel structures 118b at a specific step are relatively great, the number of the dummy channel structures 118b formed at the specific step may decrease.

Widths of dummy channel structures 118b may gradually increase from the portion of the pad structure 142 adjacent to the first region R1 to the edge portion of the pad structure 142. In particular, in the pad structure 142, the widths of dummy channel structures 118b may gradually increase from the upper steps to the lower steps in the first direction. In the pad structure 142, the number of the dummy channel structures 118b may be gradually decrease from the upper steps to the lower steps in the first direction. In example embodiments, the number of the dummy channel structures 118b formed at the respective steps may be different.

In some example embodiments, as shown in FIG. 1B, the number of the dummy channel structures 118b formed at adjacent steps may be equal to each other. Particularly, adjacent steps in the first direction may define a step group, with first, second, third and fourth step groups G1, G2, G3 and G4 are shown in FIG. 1B. The number of the dummy channel structures 118b formed at adjacent steps in each of the first to fourth step groups G1, G2, G3 and G4 may be equal to each other. For example, when the pad structure 142 includes 40 steps in the first direction, 10 steps in the first direction may be included in one step group. The number of the dummy channel structures 118b formed at respective first to ten steps in the first step group G1 may be equal to each other. In the same manner, the number of the dummy channel structures 118b formed at respective steps in each of the second to fourth step groups G2, G3 and G4 may be equal. In the pad structure 142, the number of the dummy channel structures 118b may gradually increase from the first step group G1 to the fourth step group G4.

The contact plugs 144 may pass through the first and second upper insulating interlayers 108 and 109 and contact upper surfaces of the conductive patterns 126 in the pad structure 142. The contact plugs 144 may be formed on respective ones of the steps. In example embodiments, the contact plugs 144 may each include a barrier pattern and a metal pattern.

In example embodiments, the contact plugs 144 may be formed on central portions of the steps. Thus, the contact plugs 144 may be arranged substantially along lines in the first direction and the second direction.

As described above, in the pad structure 142, as widths of the dummy channel structures 118b formed at the respective steps increase, the number of the dummy channel structures 118b formed at the respective steps may decrease. Thus, in the steps in the first direction of the pad structure 142, remaining areas not occupied by the contact plugs 144 and the dummy channel structures 118b may be substantially the same. In other words, exposed upper surfaces of the conductive patterns 126 in the pad structure 142 may have substantially the same area. A wiring line (not shown) may be further formed on the contact plug 144.

FIGS. 3 to 15 are cross-sectional views, plan views and perspective views illustrating stages of a method of manufacturing a vertical memory device in accordance with example embodiments. More particularly, FIGS. 3, 4, 7, 9, 12, 13 and 14 are cross-sectional views, FIGS. 5, 8, 10 and 15 are plan views, and FIGS. 6 and 11 are perspective views.

Figure 3:
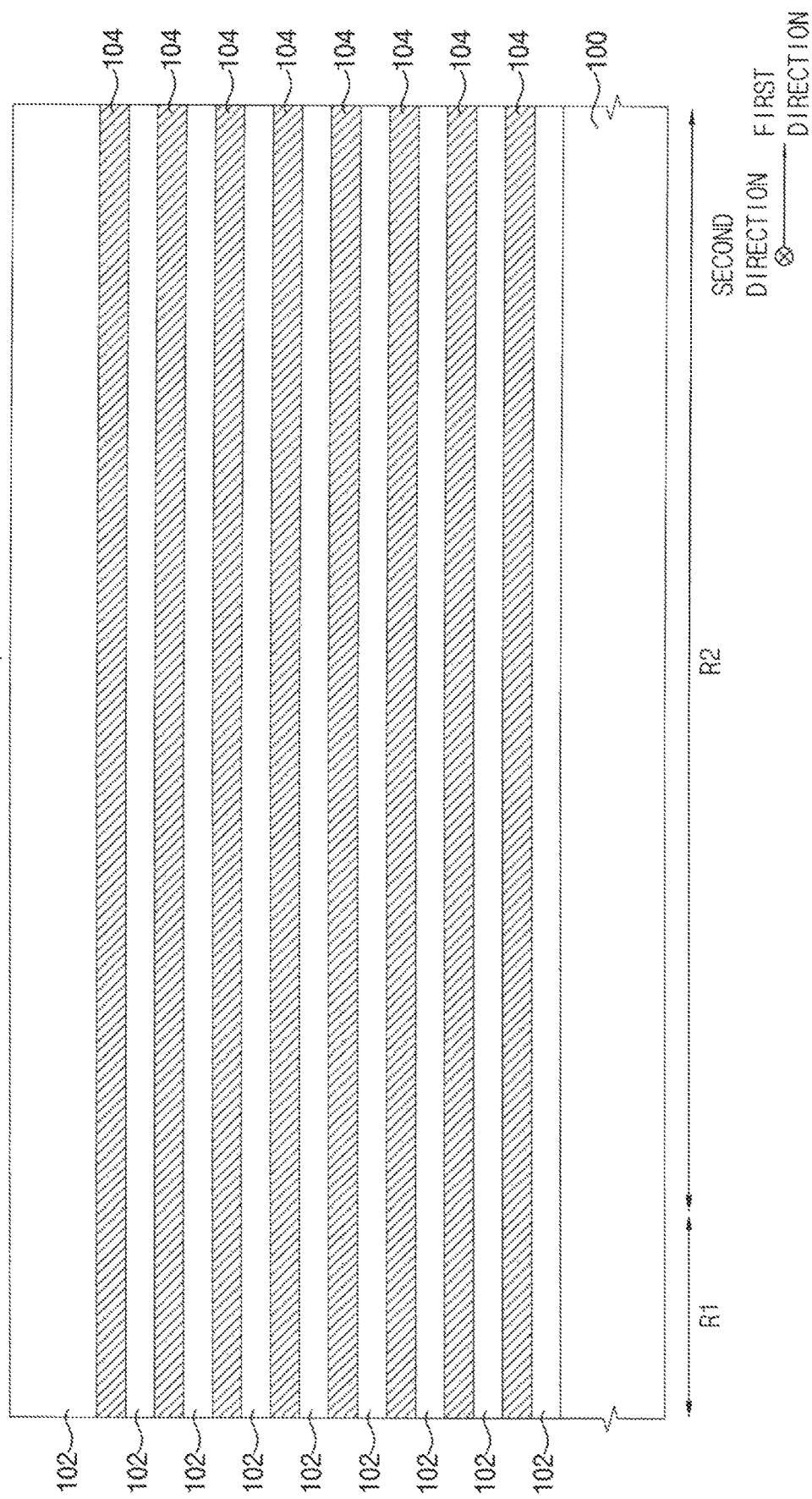

Referring to FIG. 3, a preliminary mold structure 106 may be formed on first and second regions R1 and R2 of a substrate 100. Insulation layers 102 and sacrificial layers 104 may be alternately formed on the substrate 100 to form the preliminary mold structure 106. In example embodiments, a lowermost insulation layer 102 may serve as a pad insulation layer. An uppermost insulation layer 102 may have a thickness greater than other insulation layers 102 in the preliminary mold structure 106.

In example embodiments, the insulation layers 102 may be formed of an oxide-based material, e.g., silicon oxide, SiC, SiOF, etc. In example embodiments, the sacrificial layers 104 may be formed of a nitride-based material, e.g., silicon nitride and/or silicon boronitride.

Figure 4:
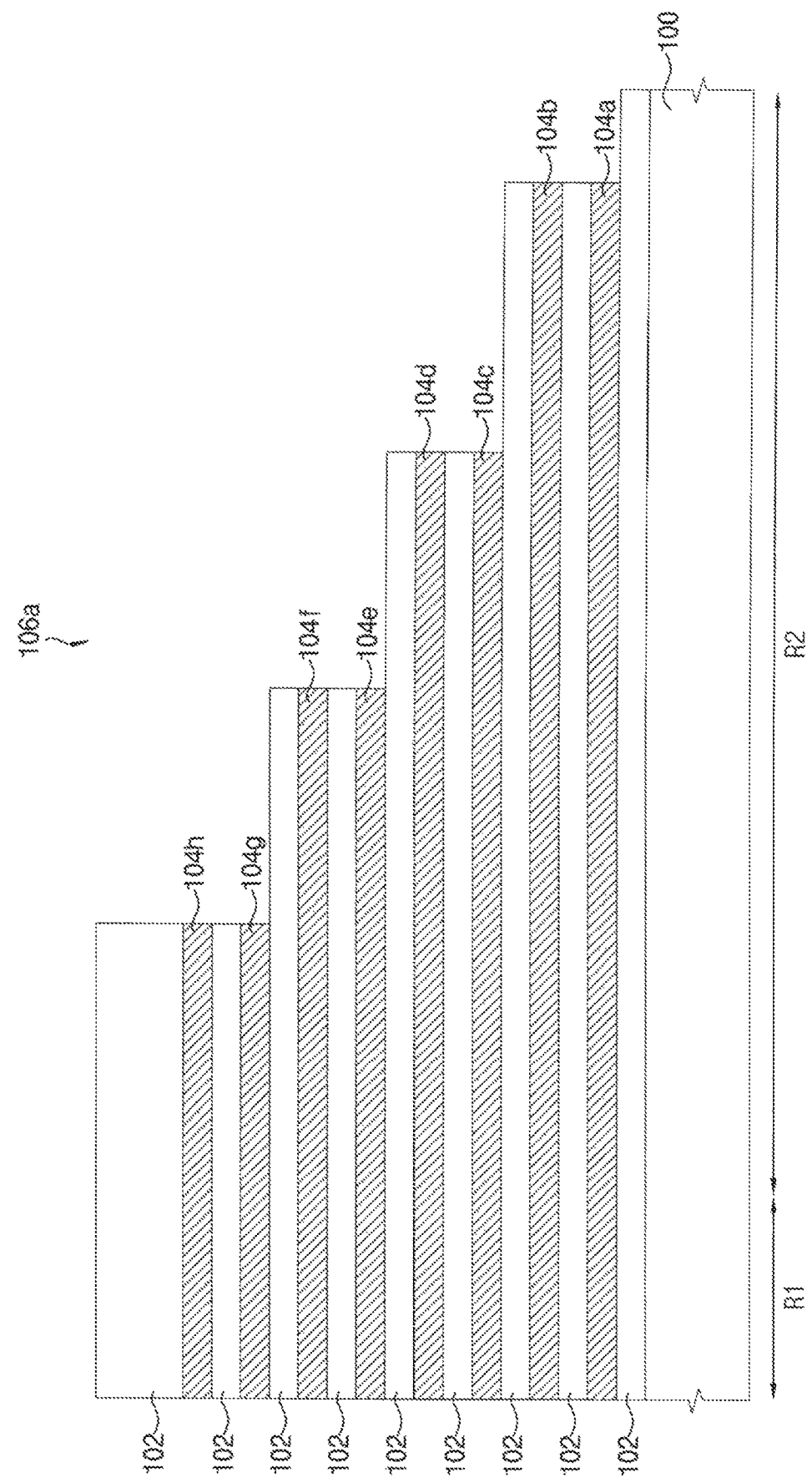
Figure 5:
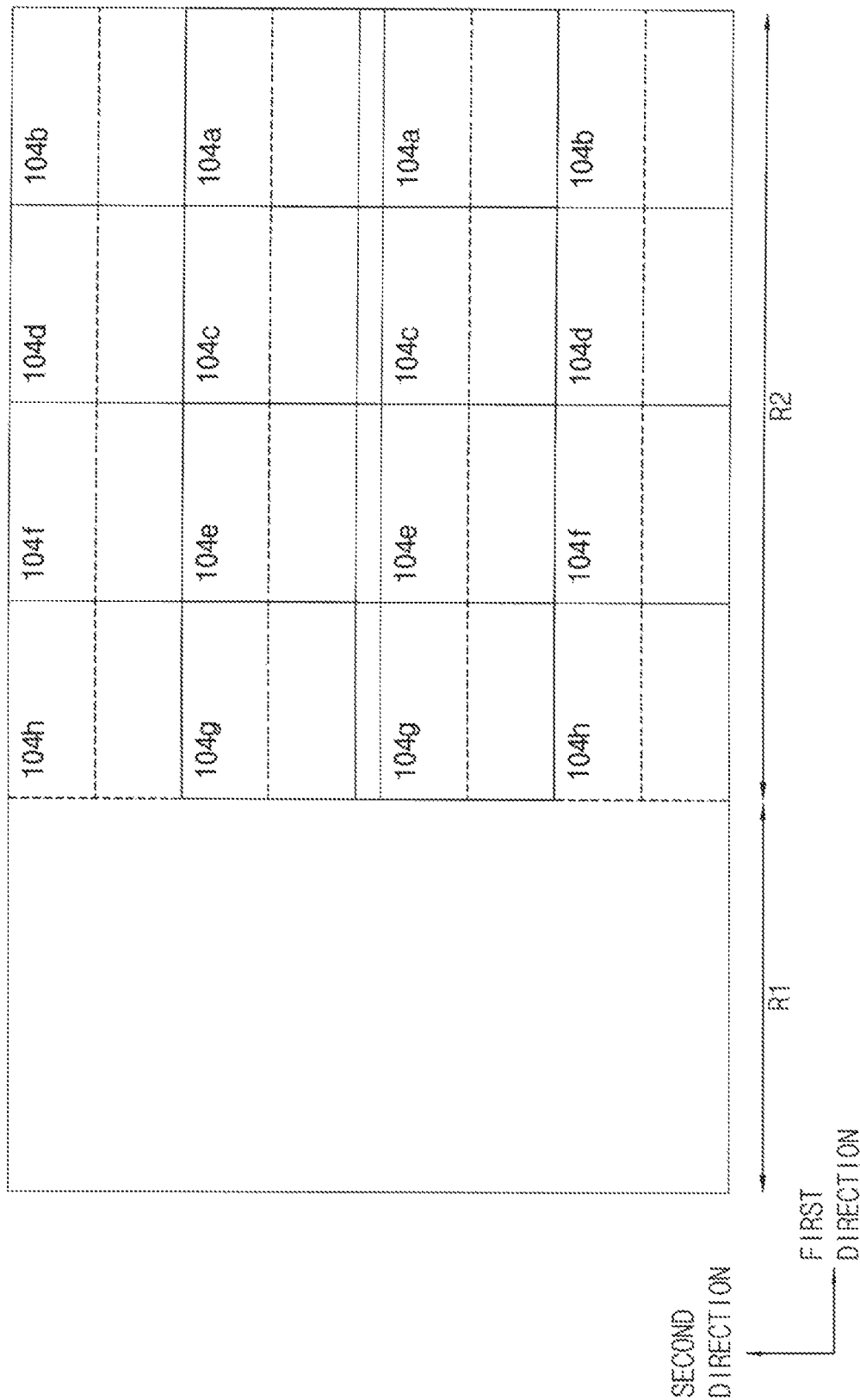
Figure 6:
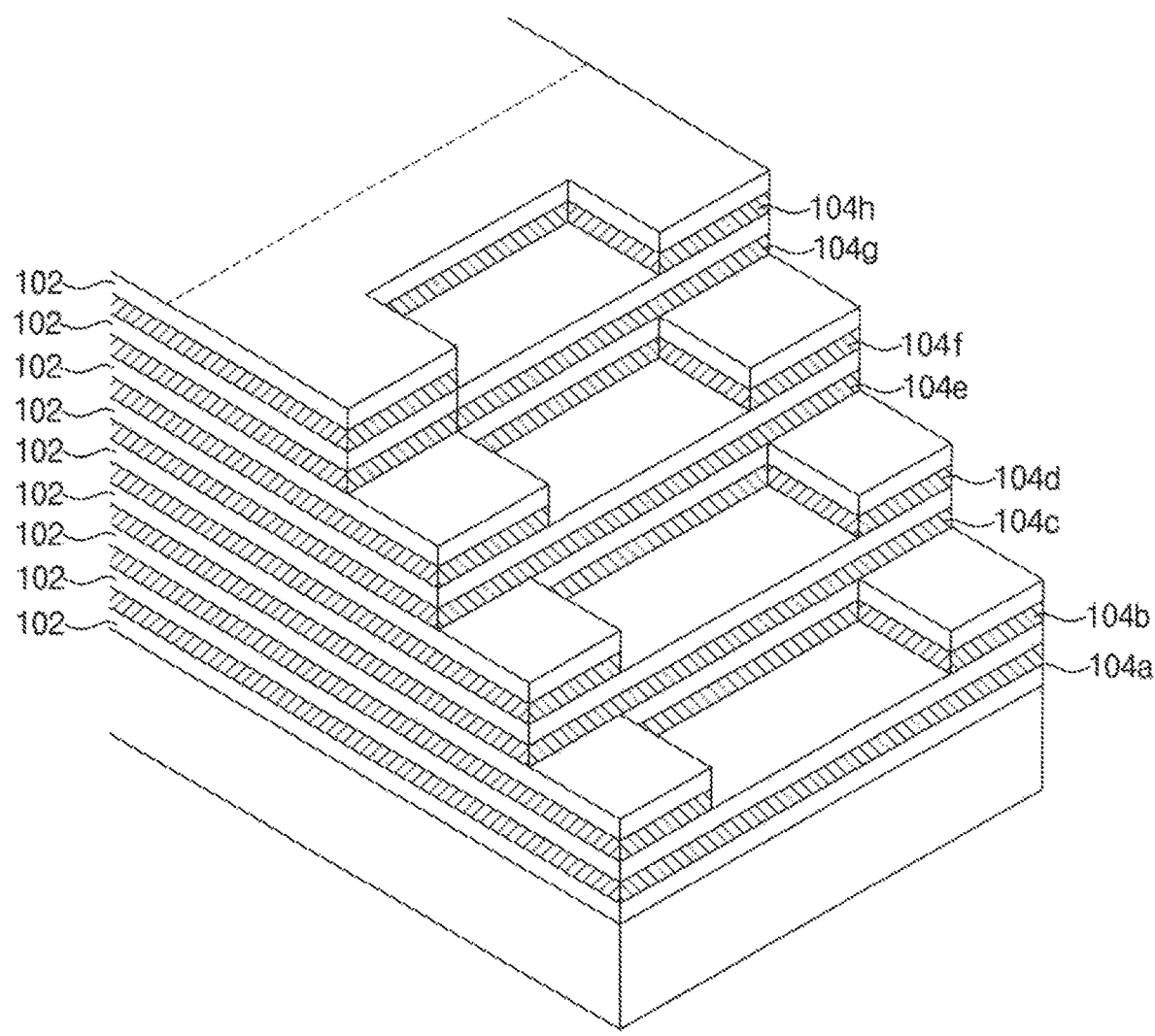

Referring to FIGS. 4, 5 and 6, edge portions of the preliminary mold structure 106 on the second region R2 may be sequentially etched to form a preliminary step mold structure 106a. In example embodiments, the preliminary step mold structure 106a on the second region R2 may have a staircase arrangement in each of the first and second directions.

The sacrificial layers 104 of the preliminary step mold structure 106a on the first region R1 may be transformed into conductive patterns of memory cells by subsequent processes.

In the preliminary step mold structure 106a on the second region R2, each of the steps will serve as pads electrically connected to the conductive patterns of the memory cells that are formed by subsequent processes. In the preliminary step mold structure 106a, the number of the steps may be equal to the number of the steps of the stacked sacrificial layers 104. As the number of the steps in the second direction increases, the number of the steps in the first direction may decrease. The number of the steps in the first and second directions may vary. As shown in FIGS. 5 and 6, when 2 steps are formed in the second direction, the number of the steps in the first direction may be half of the number of the stacked sacrificial layers 104.

Figure 7:
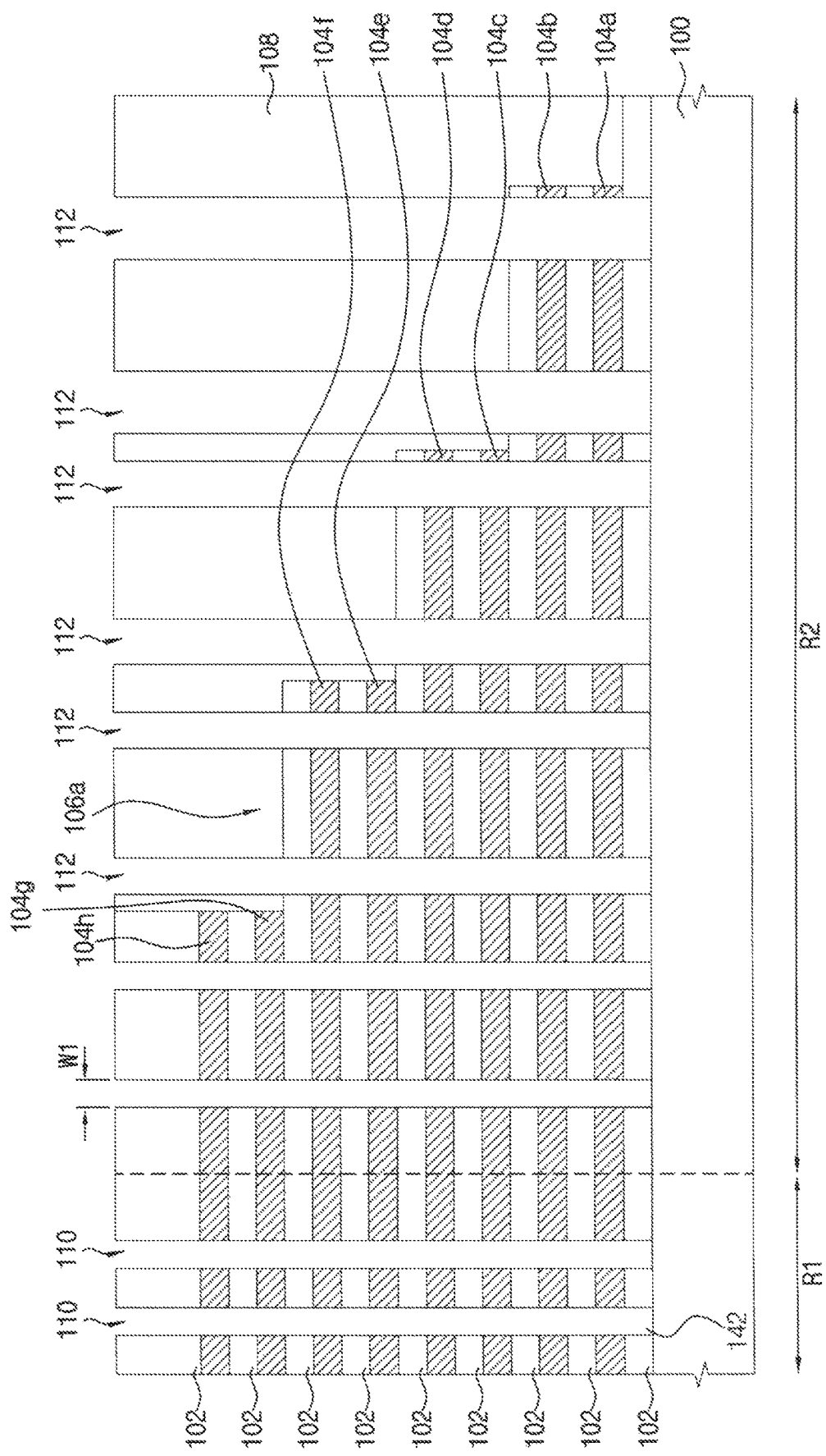
Figure 8:
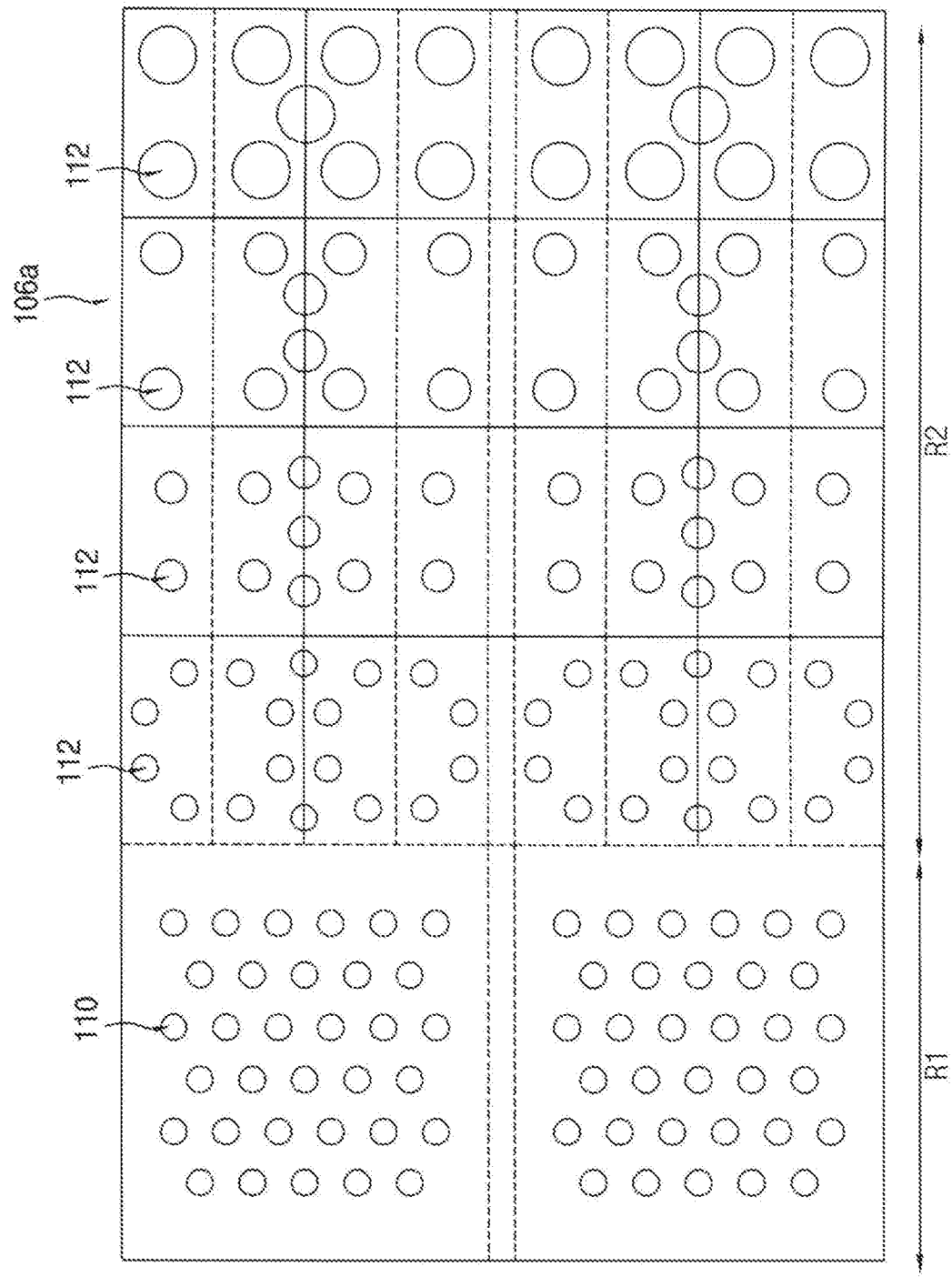

Referring to FIGS. 7 and 8, a first upper insulating interlayer 108 may be formed on the preliminary step mold structure 106a. An upper surface of the first upper insulating interlayer 108 may be substantially flat.

In example embodiments, the first upper insulating interlayer 108 may be formed by depositing an oxide layer including, e.g., silicon oxide, SiC or SiOF, and planarizing an upper surface of the oxide layer. The planarization process may include a chemical mechanical polishing (CMP) process and/or an etch back process.

The preliminary step mold structure 106a and the first upper insulating interlayer 108 may be anisotropically etched to form a plurality of holes exposing upper surfaces of the substrate 100. The holes may be formed through the preliminary step mold structure 106a and the first upper insulating interlayer 108. The holes may include channel holes 110 and dummy channel holes 112. The channel holes 110 may be formed through the preliminary step mold structure 106a on the first region R1, and the dummy channel holes 112 may be formed through the preliminary step mold structure 106a on the second region R2. Channel structures may be formed in the channel holes 110, and dummy channel structures may be formed in the dummy channel hole 112.

The channel holes 110 may uniformly have a first width W1. However, the dummy channel holes 112 may have different widths according to positions thereof. Each of the dummy channel holes 112 may have a width substantially the same as or greater than the first width W1.

According to the positions of the dummy channel holes 112, the number of the dummy channel holes 112 per a unit area (or a density of the dummy channel structures) may vary. Where widths of the dummy channel holes 112 formed at a specific step are relatively great, the density of the dummy channel holes 112 formed at the specific step may be relatively small. Hereinafter, operations for forming the channel holes and the dummy channel holes are described.

The channel holes 110 may be formed through the preliminary step mold structure 106a in region R1, outside of the stair stepped portion of region R2. The insulation layers 102 and the sacrificial layers 104 may be etched to form the channel holes 110. The etched layers in which the channel holes 110 are formed may be substantially the same as each other regardless of the positions thereof. Thus, the channel holes 110 may have the first width W1 that may be uniform.

The dummy channel holes 112 may be formed through the preliminary step mold structure 106a and the first upper insulating interlayer 108 in the staircased region. As the preliminary step mold structure 106a on the second region R2 may have the staircase arrangement, the first upper insulating interlayer 108 may have different thicknesses according to positions thereof. Thus, etched layers in which the dummy channel holes 112 are formed may vary according to positions thereof. For example, the first upper insulating interlayer 108 on upper steps of the preliminary step mold structure 106a may be relatively thin, while the first upper insulating interlayer 108 on lower steps of the preliminary step mold structure 106a may be relatively thick. The thickness of the first upper insulating interlayer 108 on the preliminary step mold structure 106a may increase toward the edge of the preliminary step mold structure 106a.

The dummy channel holes 112 at the edge portion of the preliminary step mold structure 106a may be formed by etching a thick portion of the first upper insulating interlayer 108 and a thin portion of the preliminary step mold structure 106a. The dummy channel hole at a portion adjacent to the first region R1 of the preliminary step mold structure 106a may be formed by etching a thin portion of the first upper insulating interlayer 108 and a thickness portion of the preliminary step mold structure 106a.

The preliminary step mold structure 106a may include a stack of interleaved silicon oxide and silicon nitride layers, and the first upper insulating interlayer 108 may include silicon oxide. Therefore, when the preliminary step mold structure 106a and the first upper insulating interlayer 108 are etched together, the first upper insulating interlayer 108 may be etched at a greater rate. In an anisotropic etching process for forming the channel hole 110 and the dummy channel hole 112, etching of the preliminary step mold structure 106a and the first upper interlayer insulating layer 108 on the second region R2 may expose the substrate 100 before the etching of preliminary step mold structure 106a on the first region R1 exposes the substrate 100. In other words, the substrate 100 may be first exposed at the edge portion of the preliminary step mold structure 106a.

Therefore, the anisotropic etching process may continue after the substrate 100 is exposed in the edge portion. Thus, an upper sidewall of each of the holes may be further etched, so a width of the dummy channel hole 112 may increase. Therefore, the width of the dummy channel hole 112 may be greater than a width of the channel hole 110.

The widths of dummy channel holes 112 may increase from the portion adjacent to the first region R1 to the edge portion of the preliminary step mold structure 106a. In particular, the widths of dummy channel holes 112 may increase in a stepwise manner from the upper steps to the lower steps.

As the widths of the dummy channel holes 112 increase, it may be desirable that a density of the dummy channel holes 112 decreases. For example, in the preliminary step mold structure 106a, the number of the dummy channel holes 112 may decrease from the upper steps to the lower steps. The density of dummy channel holes 112 may decrease from the upper steps to the lower steps.

Figure 9:
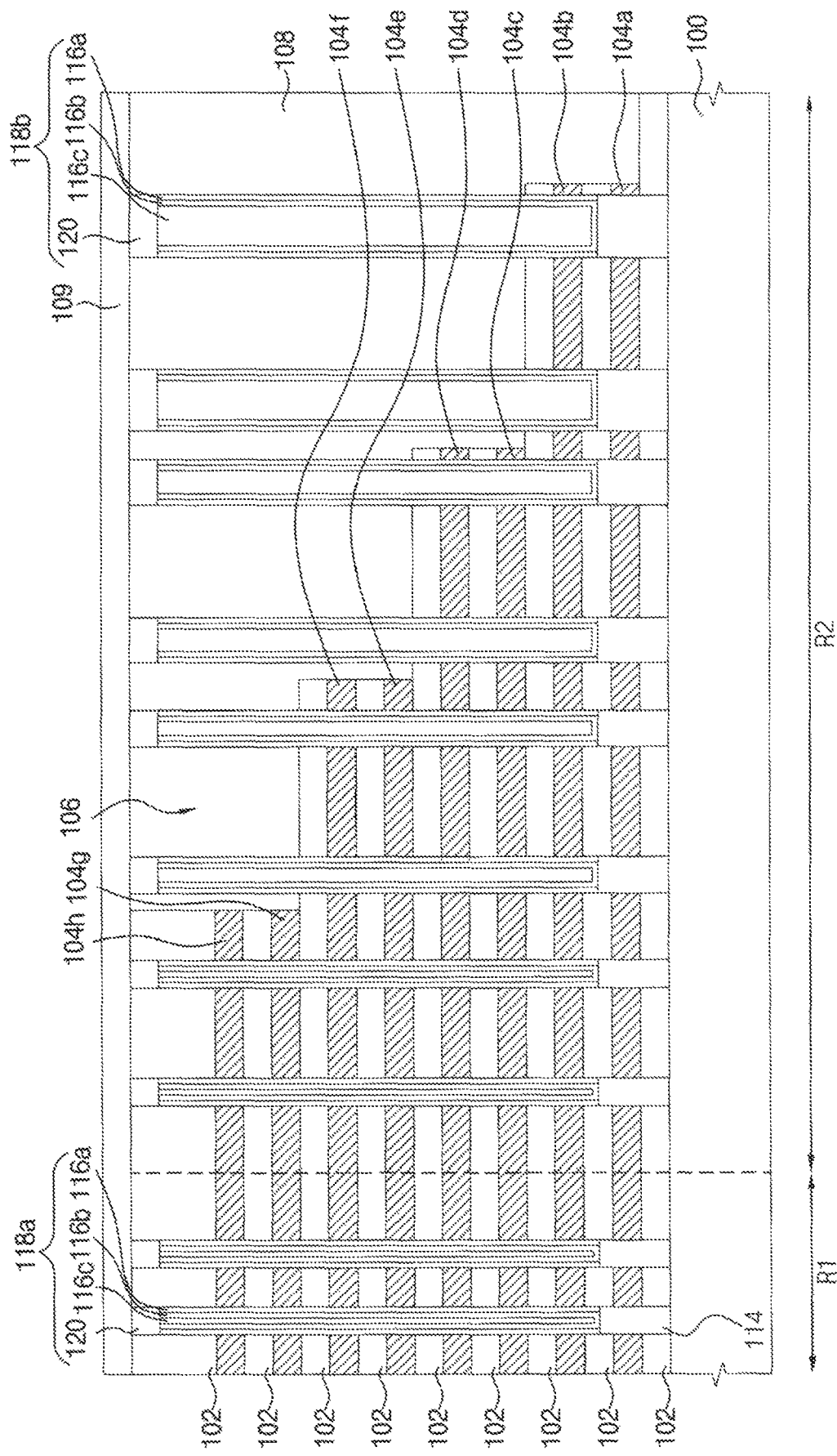

Referring to FIG. 9, a channel structure 118a may be formed in each of the channel holes 110. The dummy channel structure 118b may be formed in each of the dummy channel holes 112.

In example embodiments, respective semiconductor patterns 114 may be formed on the substrate 100 under respective ones of the channel structures 118a and the dummy channel structures 118b. A second upper insulating interlayer 109 may be formed on the first upper insulating interlayer 108 and the preliminary step mold structure 106a. An upper surface of the second upper insulating interlayer 109 may be flat.

The semiconductor patterns 114 may be formed by a selective epitaxial growth (SEG) process using a top surface of the substrate 100 exposed by the channel holes 110 and the dummy channel holes 112 as a seed. The channel structures 118a may be formed on the semiconductor patterns 114 to fill the channel holes 110, and the dummy channel structures 118b may be formed on the semiconductor patterns 114 to fill the dummy channel holes 112. The channel structures 118a and the dummy channel structures 118b may be have substantially the same layered structure. In example embodiments, the channel structures 118a and the dummy channel structures 118b may each include a dielectric structure 116a, a channel 116b and a filling insulation pattern 116c. The dielectric structure 116a may include a tunnel insulation layer, a charge storage layer and a blocking dielectric layer. In example embodiments, an upper conductive pattern 120 may be further formed on the dielectric structure 116a, the channel 116b and the filling insulation pattern 116c. The upper conductive pattern 120 may be formed of, for example, polysilicon.

The dummy channel structures 118b may be formed to fill the dummy channel holes 112, so that a width and an arrangement of the dummy channel structures 118b may be substantially the same as a width and an arrangement of the dummy channel holes 112, respectively. Thus, widths of dummy channel structures 118b may increase from the portion adjacent to the first region R1 to the edge portion of the preliminary step mold structure 106a. The number of the dummy channel structures 118b per a unit area may decrease from the portion adjacent to the first region R1 to the edge portion of the preliminary step mold structure 106a. In the preliminary step mold structure 106a, the number of the dummy channel structures 118b may decrease from the upper steps to the lower steps.

Figure 10:
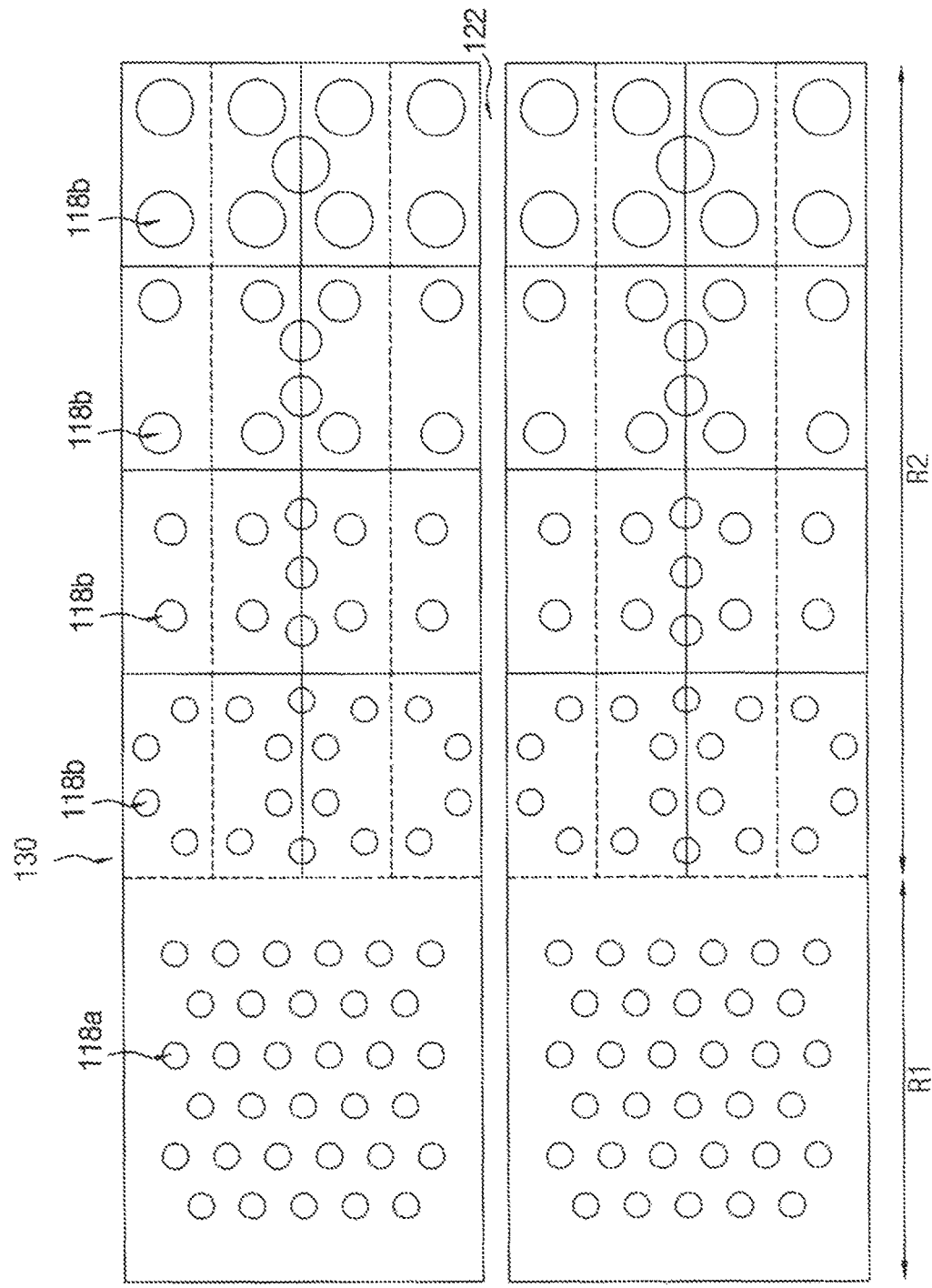

Referring to FIGS. 10 and 11, the preliminary step mold structure 106a, and the first and second upper insulating interlayers 108 and 109 may be anisotropically etched to form an opening 122 extending along the first direction. Thus, the preliminary step mold structure 106a may be divided to form a step mold structure 130 between the openings 122. An upper surface of the substrate 100 may be exposed by the opening 122.

In FIG. 11, the channel structure 118a and the dummy channel structure 118b are not shown, and only the step mold structure 130 is shown. The step mold structure 130 on the first region R1 may be transformed into a conductive pattern structure by subsequent processes. The step mold structure 130 on the first region R1 may be transformed into a conductive pattern structure by subsequent processes. The step mold structure 130 on the second region R2 may include steps in each of first and second directions.

In embodiments explained hereinafter, each of the step mold structures 130 has 4 steps in the first direction and 2 steps in the second direction. Thus, the step mold structure 130 has 8 steps in different planes.

Figure 12:
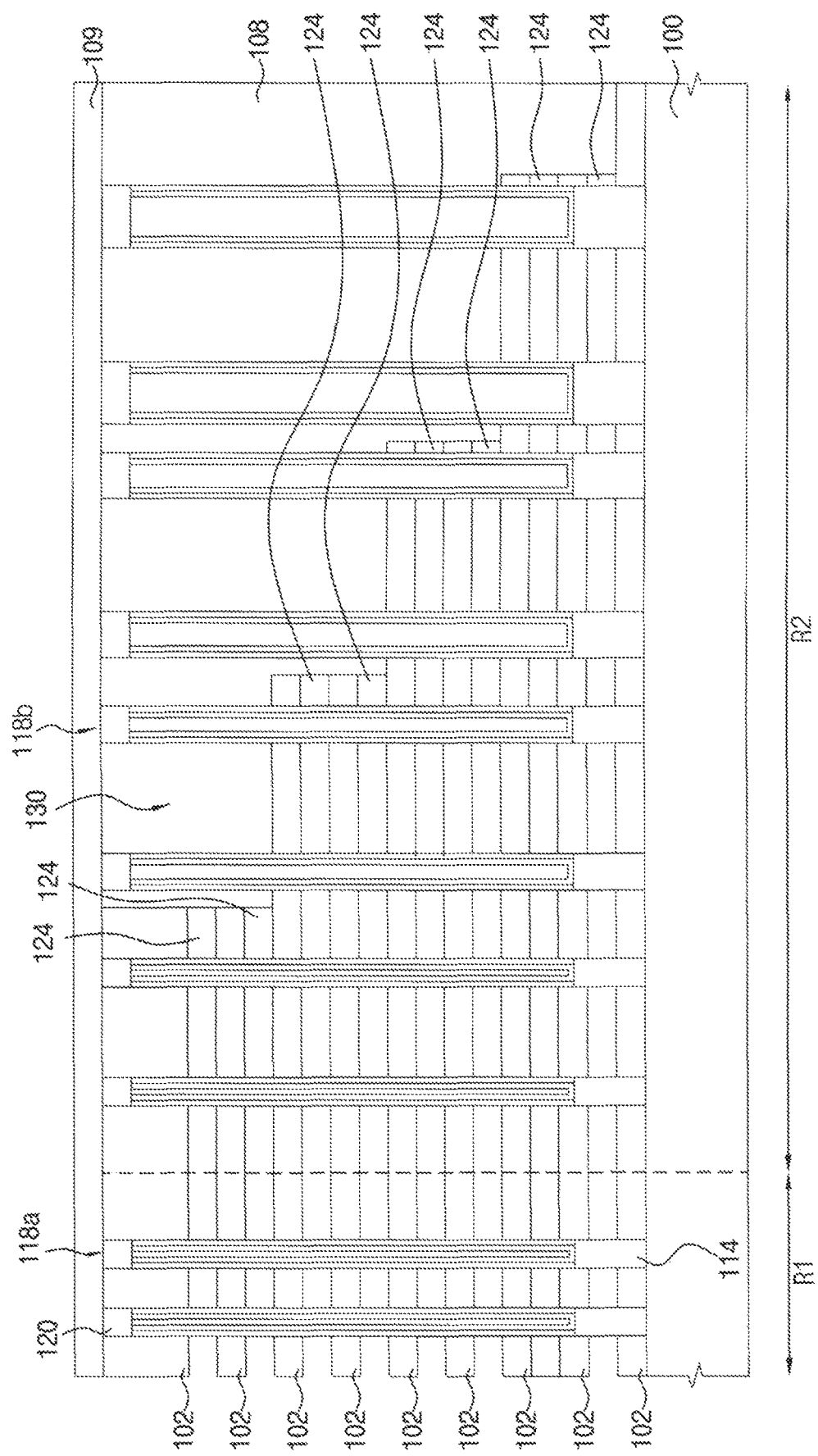

Referring to FIG. 12, the sacrificial layers 104 exposed by the opening 122 may be removed to form gaps 124 between the insulation layers 102. In example embodiments, the sacrificial layers 104 may be removed by an isotropic etching process. After the sacrificial layers 104 are removed, the insulation layers 102 remain supported by the channel structures 118a and the dummy channel structures 118b.

In the region in which the dummy channel structures 118b having relatively small widths are formed, the step mold structure 130 may be supported by a large number of dummy channel structures 118b. Thus, the gaps 124 between the insulation layers 102 in the step mold structure 130 may be maintained.

The number of the dummy channel structures 118b may be smaller in a region in which the dummy channel structures 118b having relatively large widths are formed. As the dummy channel structures 118b have relatively large widths, the step mold structure 130 may be stably supported by a small number of the dummy channel structures 118b. In addition, a contact plug region between the dummy channel structures 118b may be secured. Thus, the likelihood of shorting between the dummy channel structures 118b and contact plugs may be reduced.

Figure 13:
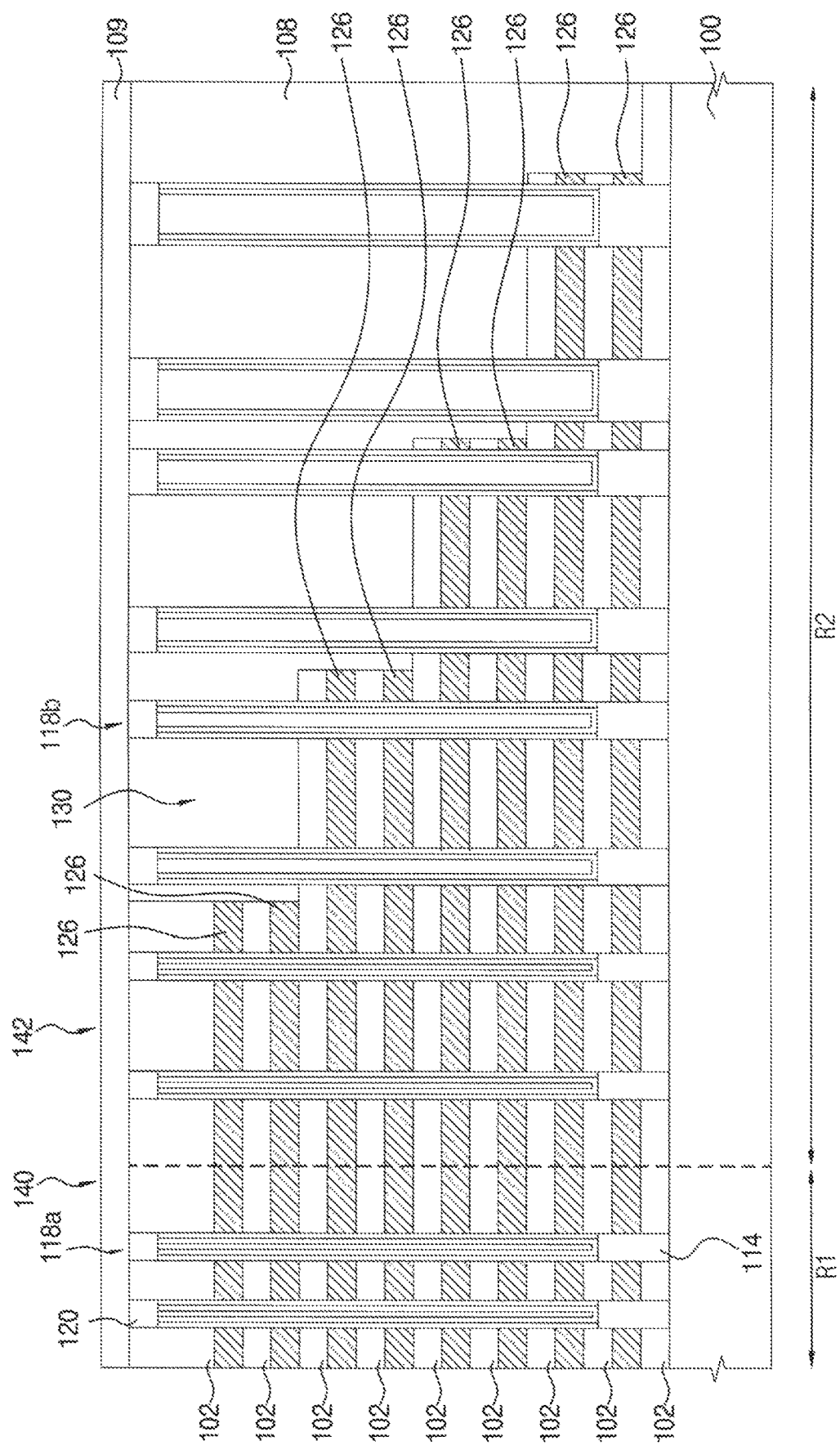

Referring to FIG. 13, a conductive layer may be formed to fill the gaps 124 so that conductive patterns 126 may be formed on the first and second regions R1 and R2.

Thus, a conductive pattern structure 140 including the conductive patterns 126 and the insulation layers 102 stacked may be formed on the first region R1. A pad structure 142 including the conductive patterns 126 and the insulation layers 102 stacked and having a staircase arrangement may be formed on the second region R2.

Areas except for the dummy channel structures 118b in respective layers stacked in the first direction in the pad structure 142 may be substantially the same. Thus, volumes of the gaps 124 filled with the conductive layer in the respective layers may be uniform and amounts of conductive material filling the gaps 124 for forming the conductive patterns may be uniform.

Figure 14:
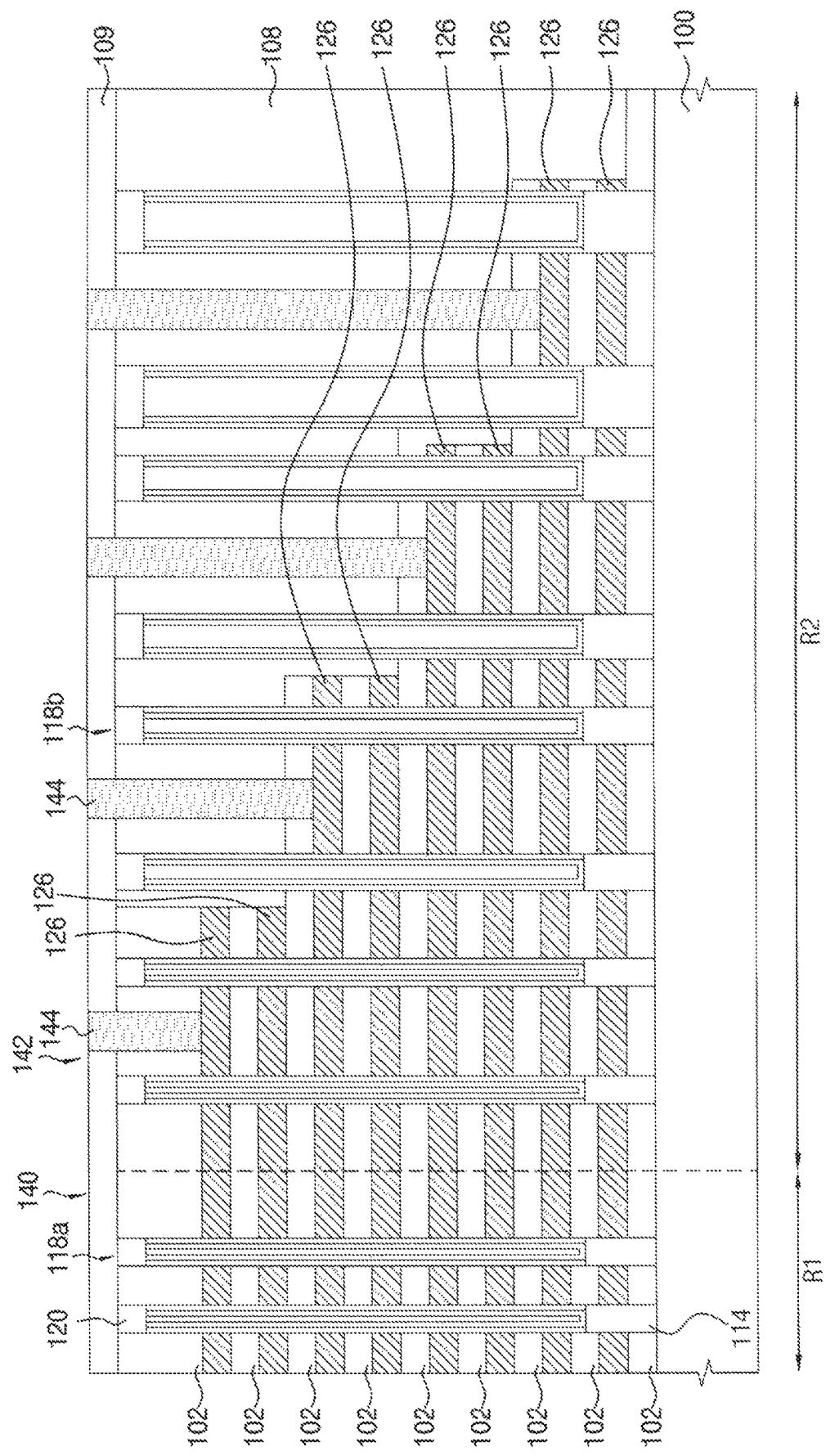
Figure 15:
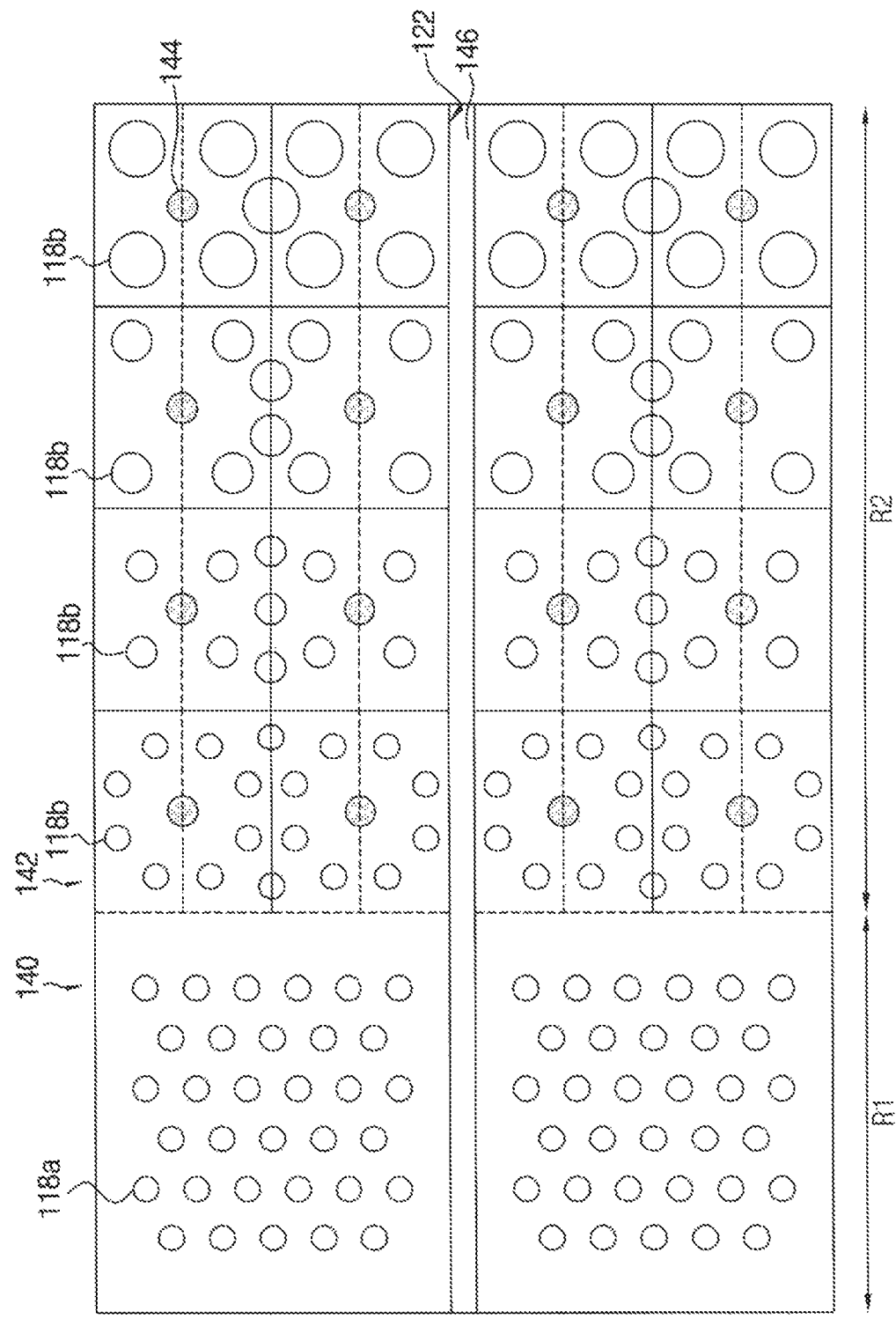

An insulation pattern 146 (refer to FIG. 15) may be formed to fill the opening 122 (refer to FIGS. 10 and 11). Referring to FIGS. 14 and 15, respective contact plugs 144 may be formed on the conductive patterns 126 in the pad structure 142, through the first and second upper insulating interlayers 108 and 109. The contact plugs 144 may be spaced apart from the dummy channel structures 118b.

The first and second upper insulating interlayers 108 and 109 and the insulation layers 102 may be etched to form contact holes exposing the conductive patterns 126 in the pad structure 142. A barrier layer may be formed on inner walls of the contact holes, and a metal layers may be formed on the barrier layer to fill the contact holes. The metal layer and the barrier layer may be planarized until the second upper insulating interlayer 109 is exposed. Wiring (not shown) electrically connected to the contact plugs 144 may be formed on the second upper insulating interlayer 109. The wiring may extend in the second direction.

Figure 16:
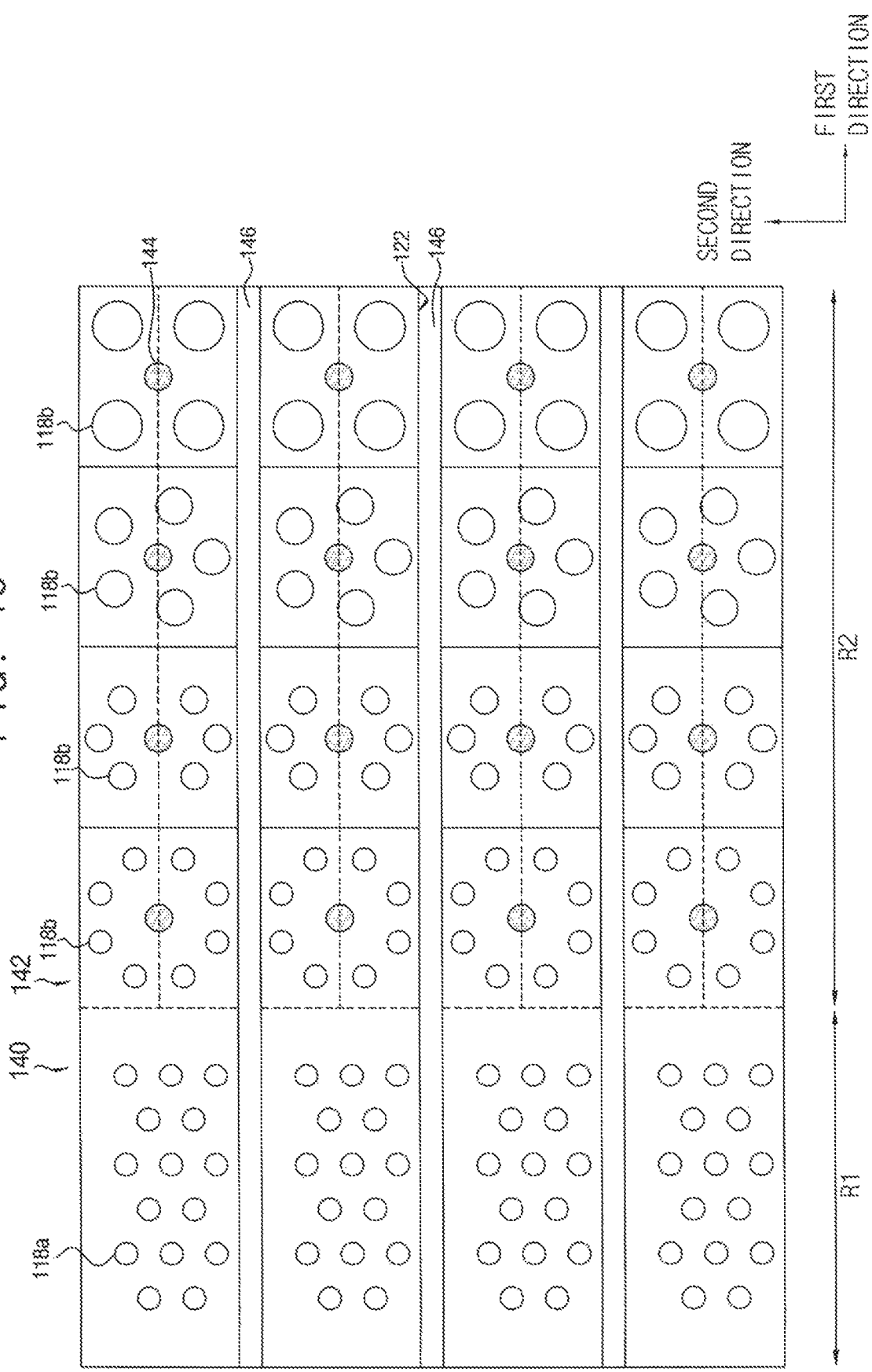
Figure 17:
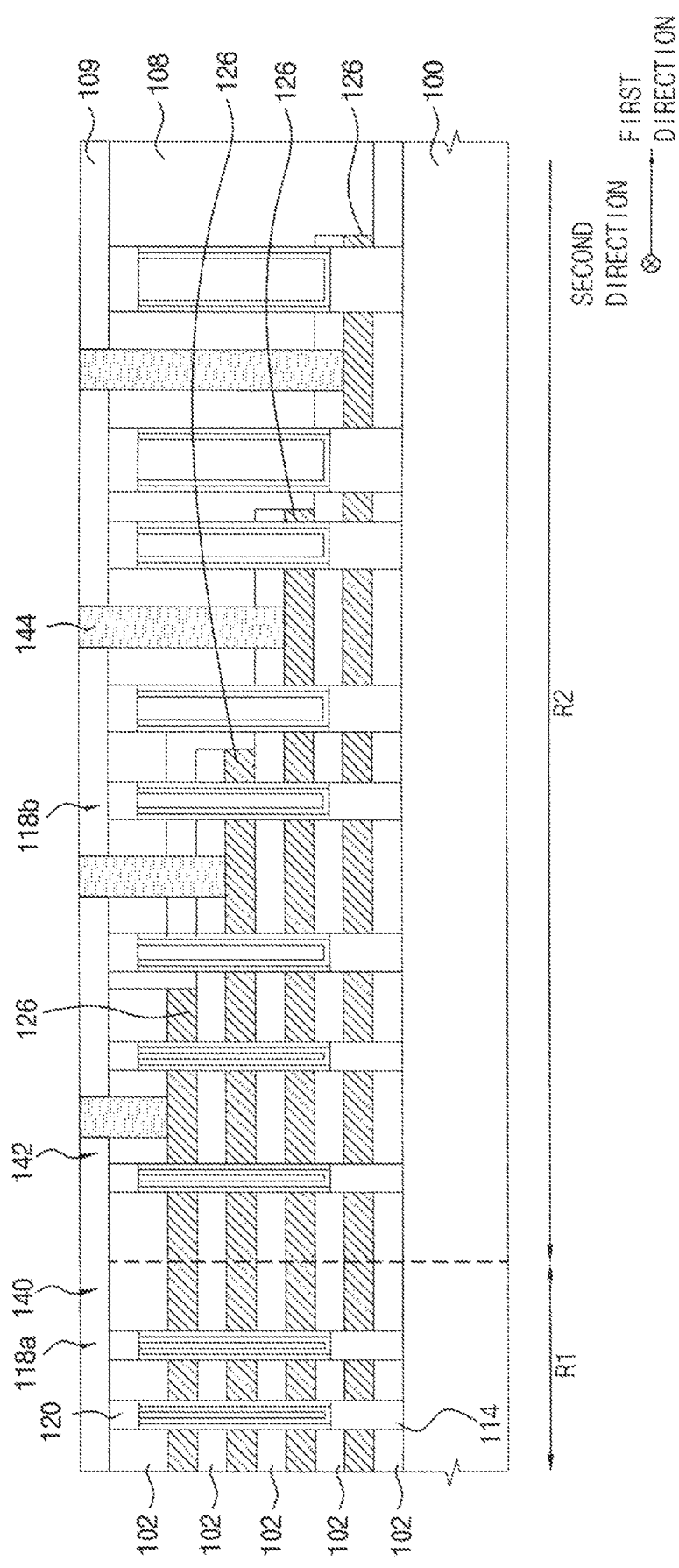

FIGS. 16 and 17 are a plan view and a cross-sectional view, respectively, illustrating a vertical memory device in accordance with example embodiments. The vertical memory device of FIGS. 16 and 17 may have elements and/or structures substantially the same as or similar to those illustrated in FIGS. 1A and 2, except it include a different step arrangement in the pad structure.

Referring to FIGS. 16 and 17, a conductive pattern structure 140 and channel structures 118a may be formed on the first region R1. The pad structure 142, the dummy channel structures 118b and contact plugs 144 may be formed on the second region R2.

An edge portion of the pad structure 142 may have a staircase arrangement. The conductive patterns 126 in the pad structure 142 may have a staircase arrangement including steps at different planes. The number of the pads in the pad structure 142 may be substantially the same as the number of the stacked conductive patterns 126 in the conductive pattern structure 140.

In example embodiments, the pad structure 142 may include steps descending in the first direction. For example, as shown in FIG. 16, the pad structure 142 may include 4 steps in the first direction. Thus, four conductive patterns 126 may be stacked in the first region R1.

A width and an arrangement of the dummy channel structures 118b may be substantially the same as a width and an arrangement of the dummy channel structures 118b illustrated with reference to FIGS. 1A and 2. In the pad structure 142, the widths of the dummy channel structures 118b may increase from upper steps to lower steps. The number of the dummy channel structures 118b may decrease from upper steps to lower steps in the first direction.

The vertical semiconductor device may be manufactured by processes substantially the same as the processes illustrated with reference to FIGS. 3 to 14. However, in the processes illustrated with reference to FIGS. 4 to 6 for forming the preliminary step mold structure, the preliminary mold structure may be patterned to form steps in the first direction. In the processes illustrated with reference to FIG. 10 for forming the opening, the position of the opening may be changed. That is, the preliminary step mold structure may be divided into separate pieces to form a step mold structure between openings having the steps in the first direction.

Figure 18:
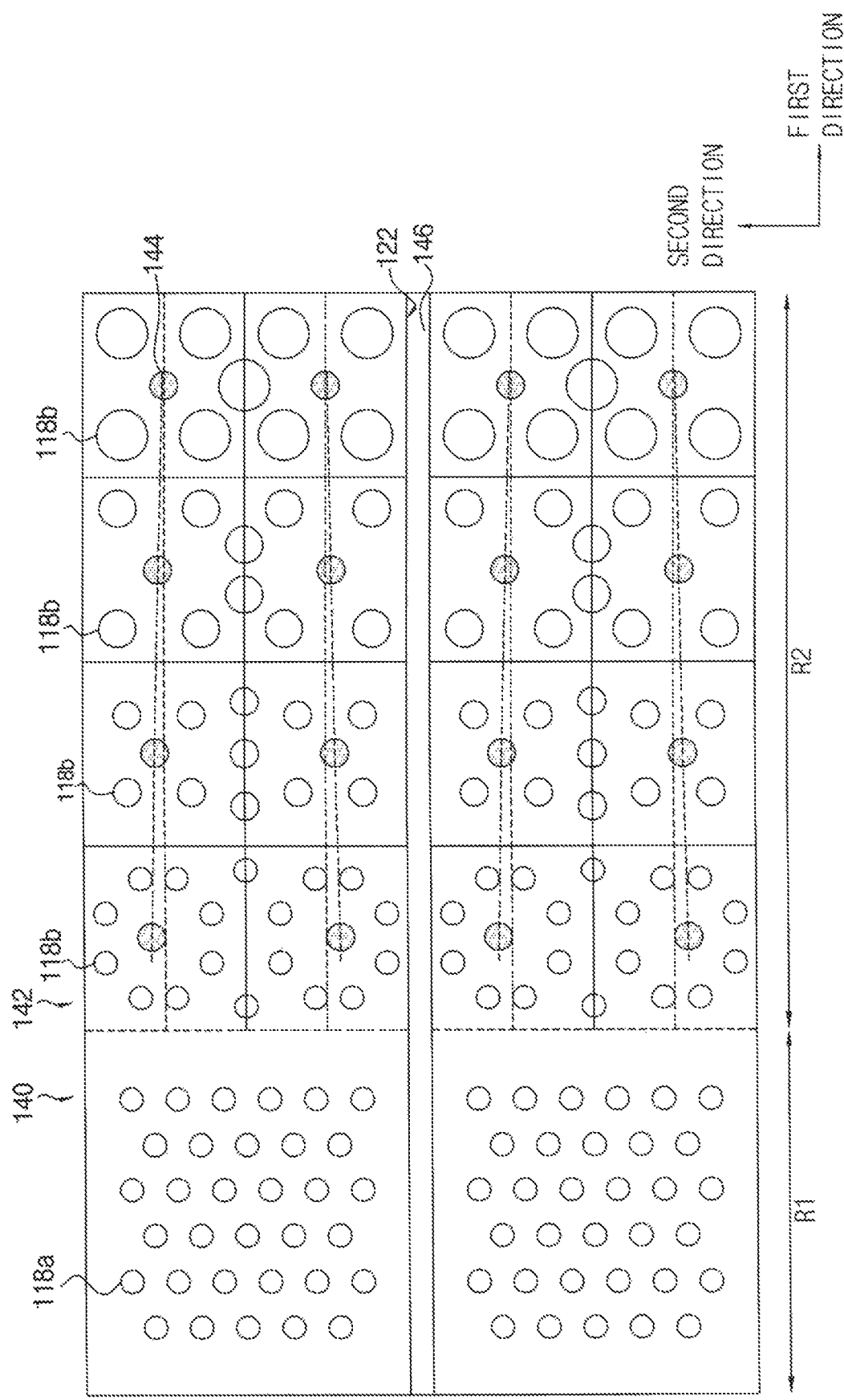

FIG. 18 is a plan view illustrating a vertical memory device in accordance with example embodiments. The vertical memory device of FIG. 18 may have elements and/or structures substantially the same as or similar to those illustrated in FIGS. 1A and 2, except for the arrangement of contact plugs.

Referring to FIG. 18, the conductive pattern structure 140 and the channel structures 118a may be formed on the first region R1. The pad structure 142, the dummy channel structures 118b and the contact plug 144 may be formed on the second region R2.

An edge portion of the pad structure 142 may have a staircase arrangement substantially the same as the staircase arrangement illustrated in FIGS. 1A and 2. The contact plugs 144 may be formed on upper surfaces of the conductive patterns in the pad structure 142 through the first and second upper insulating interlayers.

The contact plugs 144 may be formed on respective steps of the conductive patterns, and the positions of the contact plugs 144 on the steps may not be limited. In example embodiments, the contact plugs may not be linearly aligned.

For example, as shown in FIG. 18, the contact plug 144 on a lowermost step in the pad structure 142 may be formed on a central portion of the lowermost step. However, the contact plugs 144 may be disposed along an oblique direction having an angle with respect to the first direction from lower steps to upper steps.

In this case, in the pad structure 142, a distance in the second direction between adjacent contact plugs 144 may increase toward the upper steps. That is, a distance between the opening 122 and the contact plug 144 on the upper steps may be relatively small. As the distance in the second direction between adjacent contact plugs 144 may increase, a wiring region on the contact plug 144 may increase.

As described above, the position of the contact plug 144 may not be limited, and thus the wiring may be easily disposed on the contact plug 144.

Figure 19:
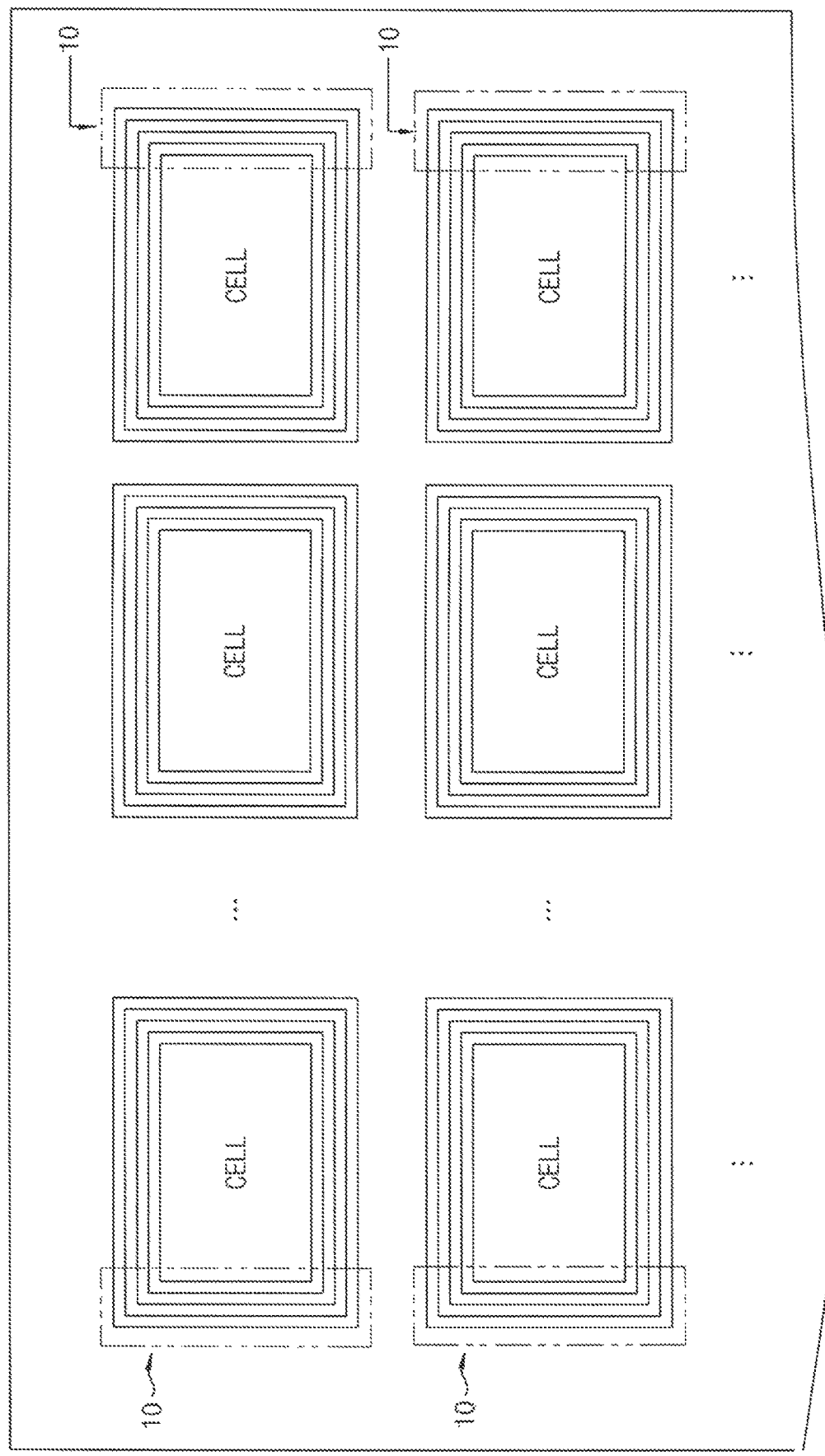
Figure 20:
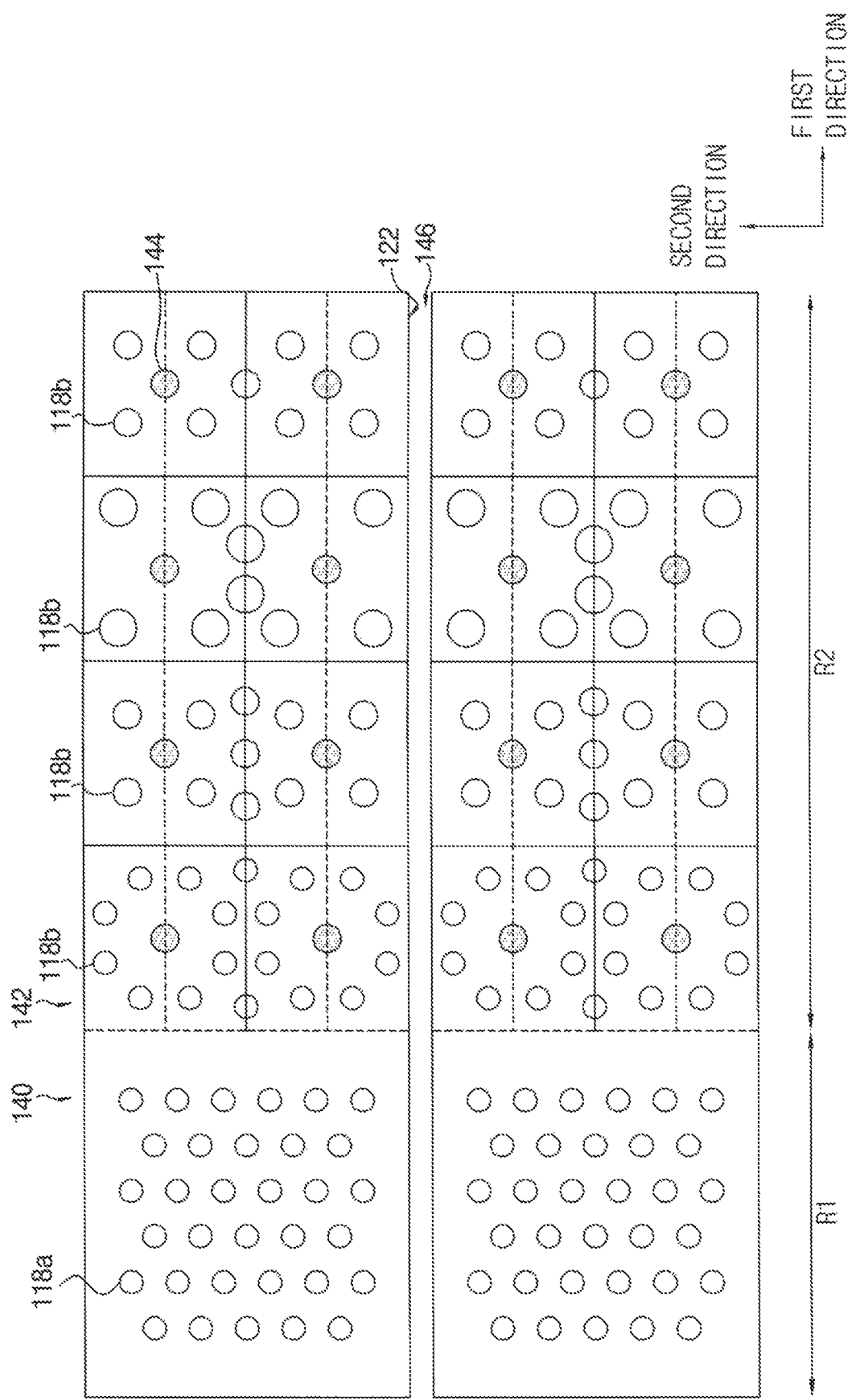

FIG. 19 is a plan view illustrating the arrangement of memory cells in a vertical memory device in accordance with example embodiments. FIG. 20 is a plan view illustrating a vertical memory device in accordance with example embodiments.

Hereinafter, referring to FIG. 20, the memory cells formed on an edge portion of a semiconductor chip, shown in FIG. 19, may be illustrated.

Referring to FIG. 20, the conductive pattern structure 140 and the channel structures 118a may be formed on the first region R1. The pad structure 142, the dummy channel structures 118b and the contact plugs 144 may be formed on the second region R2.

An edge portion of the pad structure 142 may have a staircase arrangement substantially the same as the staircase arrangement illustrated in FIGS. 1A and 2. The contact plugs 144 may be formed on upper surfaces of the conductive patterns in the pad structure through the first and second upper insulating interlayers.

According to the position of the dummy channel structure 118b, the number of the dummy channel structures 118b per unit area may vary. As widths of the dummy channel structures 118b increase in successive steps, the number of the dummy channel structures 118b formed at the steps may decrease.

In the pad structure 142, the widths of the dummy channel structures 118b may increase from upper steps to lower steps. However, when the memory cells are formed on the edge portion of the semiconductor chip, a width of the dummy channel structures 118b at the lowermost step may be less than a width of the dummy channel structures 118b at a next lowermost step. Thus, the dummy channel structure 118b formed at the next lowermost step may have a greater width.

In the pad structure 142, the number of the dummy channel structures 118b may decrease from upper steps to lower steps. However, when the memory cells are formed on the edge portion of the semiconductor chip, the number of the dummy channel structures 118b at the lowermost step may be greater than the number of the dummy channel structures 118b at the next lowermost step. Thus, the dummy channel structures 118b formed at the next lowermost step may be lesser in number.

As described above, the widths of the dummy channel structures 118b through the conductive patterns of respective levels in the pad structure may be different from each other. As the width of the dummy channel structures at a step increases, the number of the dummy channel structures formed at the step may decrease. By controlling the width and the number of the dummy channel structure 118a, the vertical semiconductor device may be formed to have a high stability for subsequent processing operations, as described above.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
   a conductive pattern structure on a substrate and comprising a stack of interleaved conductive patterns and insulation layers, wherein edges of the conductive patterns are disposed at spaced apart points along a first direction to provide conductive pads arranged as respective steps in a staircase arrangement;
   a plurality of channel structures extending through the conductive pattern structure in a second direction perpendicular to the first direction;
   a plurality of dummy channel structures extending through the conductive pads in the second direction; and
   respective contact plugs on the conductive pads,
   wherein a first one of the conductive pads has a first number of the dummy channel structures passing therethrough and wherein a second one of the conductive pads has a second number of the dummy channel structures passing therethrough that is different from the first number of the dummy channel structures;
   wherein widths of the dummy channel structures passing through the conductive pads increase from an uppermost one of the steps toward a lowermost one of the steps and wherein a width of the dummy channel structures passing through a lowermost one of the conductive pads is less than a width of the dummy channel structures passing through a next lowermost one of the conductive pads, and
   wherein a number of the dummy channel structures passing through the conductive pads decreases from the uppermost one of the conductive pads toward the lowermost one of the conductive pads and wherein a number of the dummy channel structures passing through the lowermost one of the conductive pads is greater than a number of the dummy channel structures passing through the next lowermost one of the conductive pads.

2. The vertical memory device of claim 1, wherein the dummy channel structures passing through the first one of the conductive pads have a first width, and wherein the dummy channel structures passing through the second one of the conductive pads have a second width different than the first width.

3. The vertical memory device of claim 2, wherein the first number of the dummy channel structures is less that the second number of the dummy channel structures and wherein the first width is greater than the second width.

4. The vertical memory device of claim 1, wherein the first one is lower in the staircase arrangement than the second one.

5. The vertical memory device of claim 4, wherein numbers of the dummy channel structures passing through the conductive pads decreases from an upper one of the conductive pads toward a lower one of the conductive pads in the staircase arrangement.

6. The vertical memory device of claim 1, wherein the contact plugs are linearly aligned in the first direction, and wherein one of the contact plugs contacts a central portion of the lowermost one of the conductive pads.

7. The vertical memory device of claim 1, wherein the contact plugs on the respective conductive pads are not linearly aligned in the first direction.

8. The vertical memory device of claim 7, wherein the contact plugs on the conductive pads are aligned in an oblique direction having an angle with respect to the first direction, and wherein one of the contact plugs contacts a central portion of the lowermost one of the conductive pads.

9. The vertical memory device of claim 1:
wherein the edges are first edges of the conductive patterns at spaced apart first points along the first direction to provide first conductive pads arranged as respective steps in a first staircase arrangement; and
wherein second edges of the conductive patterns are disposed at spaced apart second points along the first direction to provide second conductive pads arranged as respective steps in a second staircase arrangement.

10. The vertical memory device of claim 1, wherein the channel structures have a first width, and wherein the dummy channel structures have a second width substantially the same as or greater than the first width.

11. A vertical memory device, comprising:
a conductive pattern structure on a first region of a substrate, the conductive pattern structure including a stack of interleaved conductive patterns and insulation layers;
a pad structure on a second region of the substrate adjacent the first region of the substrate wherein edges of the conductive patterns are disposed at spaced apart points along a first direction to provide conductive pads arranged as respective steps in a staircase arrangement;
a plurality of channel structures extending through the conductive pattern structure;
a plurality of dummy channel structures extending through the pad structure; and
respective contact plugs on the conductive pads,
wherein numbers of the dummy channel structures per unit area passing through the conductive pads vary, and
wherein widths of the dummy channel structures passing through the conductive pads vary in inverse proportion to the number of the dummy channel structures passing through the conductive pads.

12. The vertical memory device of claim 11:
wherein first edges of the conductive patterns are disposed at spaced apart first points along the first direction to provide first conductive pads arranged as respective steps in a first staircase arrangement; and
wherein second edges of the conductive patterns are disposed at spaced apart second points along the first direction to provide second conductive pads arranged as respective steps in a second staircase arrangement.

13. The vertical memory device of claim 11, wherein the contact plugs on the respective conductive patterns are linearly aligned in the first direction, and wherein one of the contact plugs is formed on a central portion of an upper surface of one of the conductive patterns.

14. A vertical memory device, comprising:
a conductive pattern structure on a first region of a substrate, the conductive pattern structure including a stack of interleaved conductive patterns and insulation layers;
a pad structure on a second region of the substrate adjacent the first region of the substrate wherein edges of the conductive patterns are disposed at spaced apart points along a first direction to provide conductive pads arranged as respective steps in a staircase arrangement;
a plurality of channel structures extending through the conductive pattern structure;
a plurality of dummy channel structures extending through the pad structure; and
respective contact plugs on the conductive pads,
wherein numbers of the dummy channel structures per unit area passing through the conductive pads vary,
wherein a distance between neighboring ones of the contact plugs in a second direction substantially perpendicular to the first direction decreases from an uppermost one of the conductive pads to a lowermost one of the conductive pads, and wherein one of the contact plugs is formed on a central portion of the lowermost one of the conductive pads.

* * * * *